(12) United States Patent
Liu et al.

(10) Patent No.: US 10,274,678 B1
(45) Date of Patent: Apr. 30, 2019

(54) METHODS OF FORMING PHOTONIC DEVICES

(71) Applicant: Taiwan Semiconductor Manufacturing Co., Ltd., Hsin-Chu (TW)

(72) Inventors: Tao-Cheng Liu, Hsinchu (TW); Tsai-Hao Hung, Hsinchu (TW); Shih-Chi Kuo, Yangmei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/936,042

(22) Filed: Mar. 26, 2018

(51) Int. Cl.
| | |
|---|---|
| *G02B 6/136* | (2006.01) |
| *G02B 6/122* | (2006.01) |
| *H01L 21/308* | (2006.01) |
| *H01L 21/306* | (2006.01) |

(52) U.S. Cl.
CPC ........... *G02B 6/136* (2013.01); *G02B 6/1225* (2013.01); *H01L 21/3086* (2013.01); *H01L 21/30608* (2013.01)

(58) Field of Classification Search
CPC . G02B 6/136; G02B 6/1225; H01L 21/30608; H01L 21/3086
See application file for complete search history.

(56) References Cited

U.S. PATENT DOCUMENTS

2017/0040337 A1* 2/2017 Kim .................. H01L 27/11582

* cited by examiner

*Primary Examiner* — Anthony Ho
(74) *Attorney, Agent, or Firm* — Duane Morris LLP

(57) ABSTRACT

A method includes: forming a first plurality of tiers that each comprises first and second dummy layers over a substrate, wherein within each tier, the second dummy layer is disposed above the first dummy layer; forming a second plurality of recessed regions in the first plurality of tiers, wherein at least one subgroup of the second plurality of recessed regions extend through respective different numbers of the second dummy layers; and performing an etching operation to concurrently forming a third plurality of trenches with respective different depths in the substrate through the at least one subgroup of the second plurality of recessed regions.

15 Claims, 23 Drawing Sheets

400

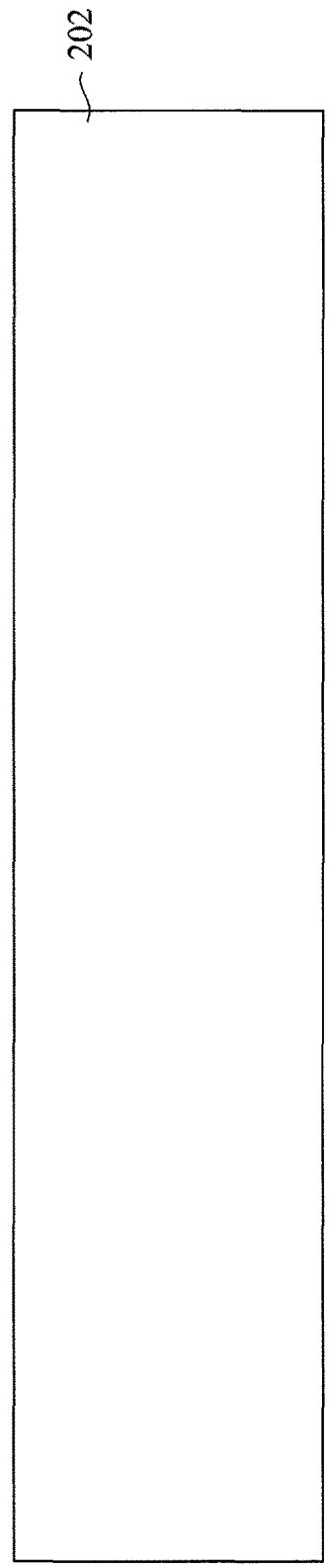

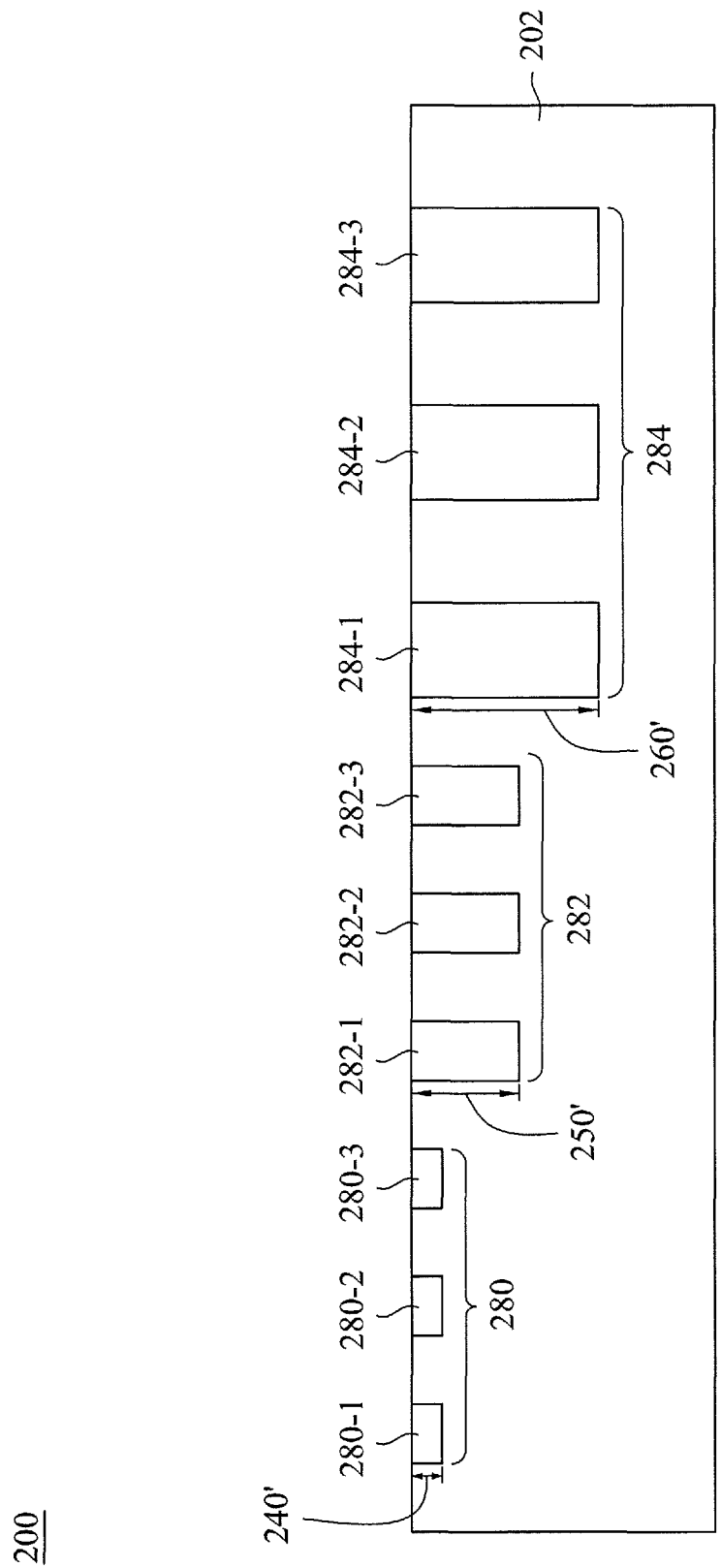

US 10,274,678 B1

METHODS OF FORMING PHOTONIC DEVICES

BACKGROUND

In today's telecommunication network, optical fibers are typically chosen over electrical cablings to transmit information in the form of light from one place to another partially because of various advantageous characteristics of the optical fibers, for example, a higher bandwidth, a longer transmission distance, etc., when compared to the electrical cablings.

To further increase the bandwidth of the optical fiber, multiplexing a plurality of optical signals on one optical fiber by using respective different wavelengths of light has been proposed, for example, a dense wavelength division multiplexing (DWDM) technique. In general, a photonic device (e.g., modulator), coupled to the optical fiber, is typically used to differentiate (e.g., divide) such a plurality of optical signals by using optical gratings to diffract the plurality of optical signals. For example, a photonic device may include a plurality of optical gratings, each of which is formed as a comb-like structure extending into a substrate with a respective depth. When the photonic device receives a plurality of optical signals that are associated with respective different wavelengths, based on the different depths, each optical grating can let one optical signal of a corresponding wavelength to pass through.

Existing techniques to make photonic devices having such a plurality of comb-like structures with respective different depths typically rely on using one single mask layer to directly etch the substrate multiple times. Such techniques, however, can cause various issues such as, for example, undesirable residues (e.g., reacted photoresist materials) remained in the formed comb-like structures, which disadvantageously impacts performance of the photonic devices. Thus, existing photonic devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIGS. 2A, 2B, 2C, 2D, 2E, 2F, 2G, and 2H illustrate cross-sectional views of an exemplary semiconductor device during various fabrication stages, made by the method of FIG. 1, in accordance with some embodiments.

DETAILED DESCRIPTION OF EXEMPLARY EMBODIMENTS

Figure 1A:
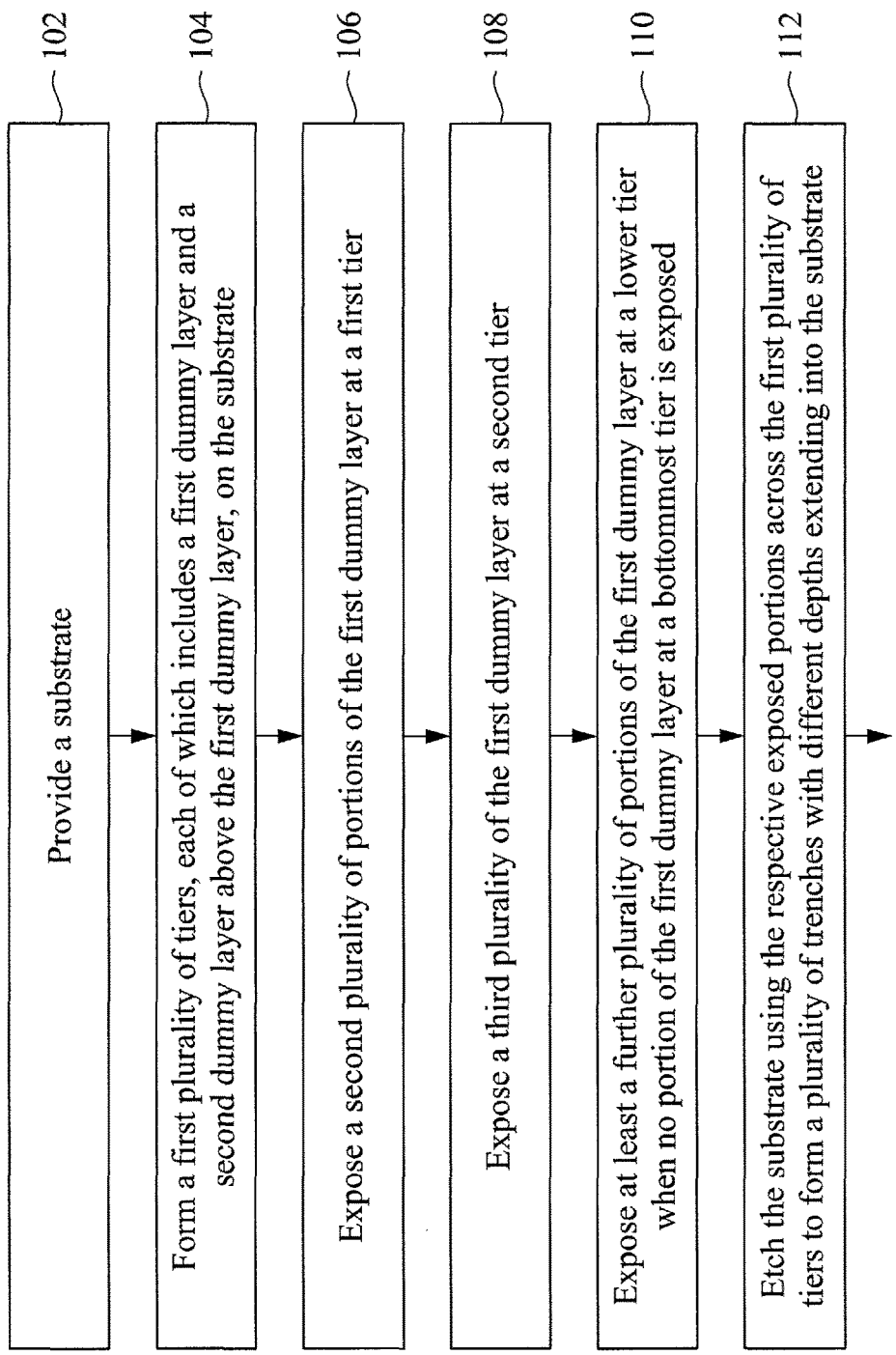
FIGS. 1A and 1B illustrate a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of novel methods to form a photonic device that includes a plurality of comb-like structures with respective different depths. More specifically, each comb-like structure includes a plurality of periodic trenches extending into a substrate with a substantially similar depth and filled with a dielectric material, and the respective depths of the comb-like structures are different from each other. Different from the existing techniques, in some embodiments of the present disclosure, a method includes forming a plurality of dummy tiers over a substrate, forming a plurality of recessed regions that each extends through a respective different number of dummy tiers, and using such a plurality of recessed regions across the dummy tiers to etch the substrate so as to form the plurality of comb-like structures.

Figure 1B:
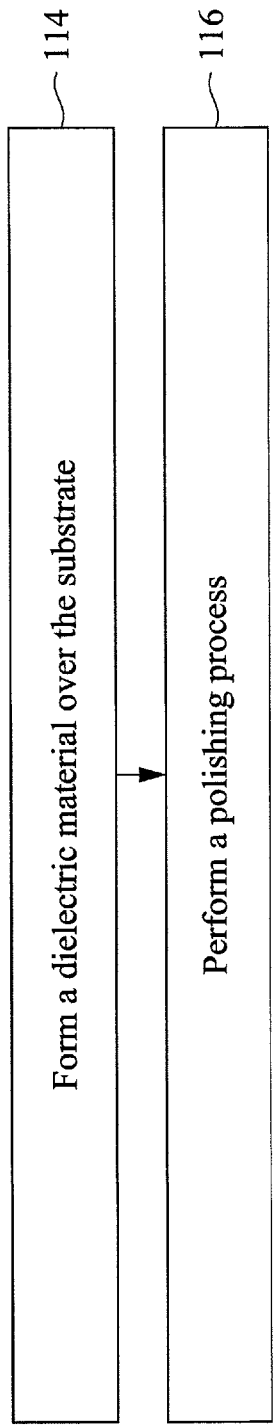

FIGS. 1A and 1B collectively illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, a photonic device. As employed by the present disclosure, the photonic device refers to any device configured to process (e.g., receive, reflect, diffract, transmit, etc.) an optical signal. It is noted that the method 100 of FIGS. 1A-1B does not produce a completed photonic device. A completed photonic device may be fabricated using complementary metal-oxide-semiconductor (CMOS) technology processing. Accordingly, it is understood that additional operations may be provided before, during, and after the method 100 of FIGS. 1A-1B, and that some other operations may only be briefly described herein.

Referring first to FIG. 1A, in some embodiments, the method 100 starts with operation 102 in which a substrate is provided. The method 100 continues to operation 104 in which a first plurality of tiers, each of which includes a first dummy layer and a second dummy layer above the first dummy layer, are formed on the substrate.

Next, the method 100 continues to operation 106 in which a second plurality of portions of the first dummy layer at a first tier are exposed. In some embodiments, the first tier may be a topmost tier among the first plurality of tiers. Further, when the second plurality of portions of the first dummy layer at the topmost tier are exposed, a plurality of first recessed regions that each extends through a respective portion of the second dummy layer at the topmost tier may be accordingly formed. The method 100 continues to operation 108 in which a third plurality of portions of the first dummy layer at a second tier are exposed. In some embodiments, the second tier is one tier lower than the first tier, for example, a next topmost tier. In some embodiments, when the third plurality of portions of the first dummy layer at the next topmost tier are exposed, a plurality of second recessed regions that each extends through a respective portion of the second dummy layer at the topmost tier, a respective portion of the first dummy layer at the topmost tier, and a respective portion of the second dummy layer at the next topmost tier may be accordingly formed. Thus, it is understood that the plurality of second recessed regions are a subgroup of the first recessed regions that further extend toward the substrate (i.e., toward a lower tier).

Next, the method 100 continues to operation 110 in which when no portion of the first dummy layer at a bottommost tier is exposed, at least a further plurality of portions of the first dummy layer at a next lower tier are exposed. In some embodiments, such a bottommost tier is the tier that includes the first dummy layer directly contacting an upper boundary of the substrate. In some embodiments, exposing the further plurality of portions of the first dummy layer at the next lower tier is substantially similar to the exposing operations as discussed above, so that the discussion is not repeated again. The method 100 continues to operation 112 in which the substrate is etched using the respective exposed portions across the first plurality of tiers to form a plurality of trenches with different depths extending into the substrate. In some embodiments, since the etching process includes an anisotropic etching process and the respective exposed portions of the first dummy layers at different tiers correspond to recessed regions with different depths, the etching process can produce the plurality of trenches with different depths extending into the substrate while using the first plurality of tiers, remained after the above exposing operations, as a mask.

Referring then to FIG. 1B, the method 100 continues to operation 114 in which a dielectric material is formed over the substrate. In some embodiments, the dielectric material is formed to fill the plurality of trenches that have different depths. The method 100 continues to operation 116 in which a polishing process is performed. In some embodiments, the polishing process (e.g., a chemical mechanical polishing (CMP) process) is performed to remove any excessive dielectric material formed above an upper boundary of the substrate and the remaining portions of the first and second dummy layers across the first plurality of tiers.

In some embodiments, operations of the method 100 may be associated with cross-sectional views of a semiconductor device 200 at various fabrication stages as shown in FIGS. 2A, 2B, 2C, 2D, 2E, 2F, 2G, and 2H, respectively. In some embodiments, the semiconductor device 200 may be a photonic device. The photonic device 200 may be included in a microprocessor, and/or other integrated circuit (IC). Also, FIGS. 2A through 2H are simplified for a better understanding of the concepts of the present disclosure. For example, although the figures illustrate the photonic device 200, it is understood the IC, in which the photonic device 200 is formed, may include a number of other devices such as, for example, a photodiode, a laser diode, an optical modulator, etc., which are not shown in FIGS. 2A through 2H, for purposes of clarity of illustration.

Corresponding to operation 102 of FIG. 1A, FIG. 2A is a cross-sectional view of the photonic device 200 including a substrate 202, which is provided at one of the various stages of fabrication, according to some embodiments. In some embodiments, the substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding. In some other embodiments, the substrate 202 may include sapphire.

Figure 2B:
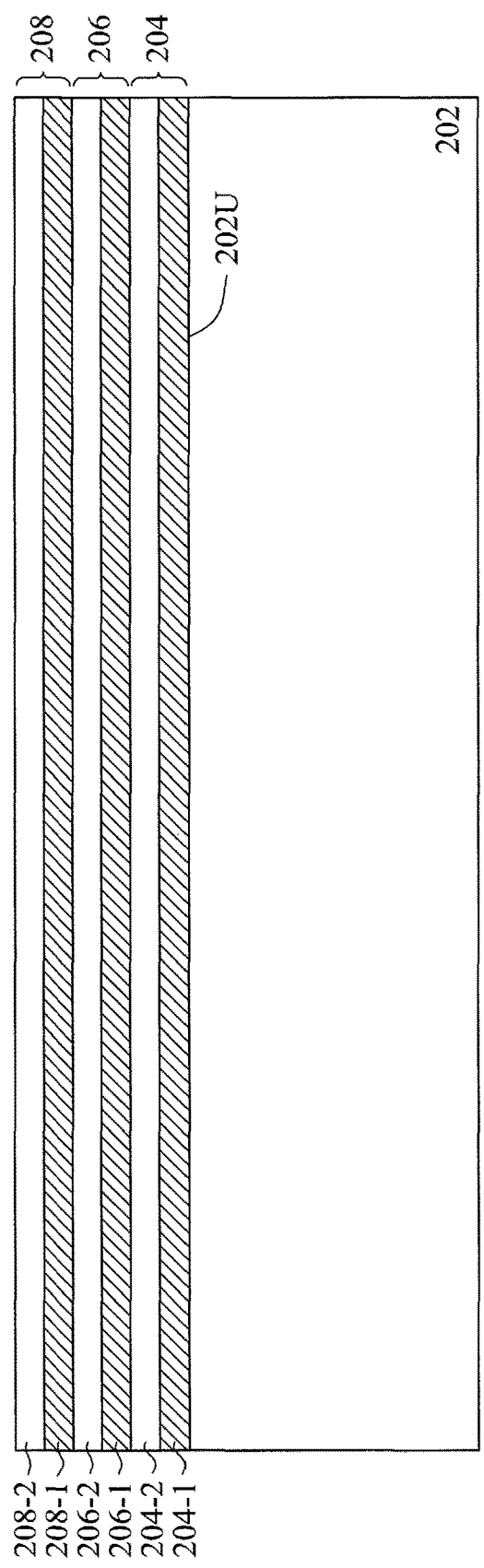

Corresponding to operation 104 of FIG. 1A, FIG. 2B is a cross-sectional view of the photonic device 200 including tiers 204, 206, and 208, which are formed at one of the various stages of fabrication, according to some embodiments. Although in the illustrated embodiments of FIG. 2B (and the following figures), it is noted that any desired number of tier can be formed over the substrate while remaining within the scope of the present disclosure. Further, in accordance with some embodiments, a number of tiers corresponds to a number of different depths by which one or more respective trenches extend into the substrate 202, which will be discussed in further detail below.

As shown in FIG. 2B, the tier 204 is disposed above the substrate 202; the tier 206 is disposed above the tier 204; and the tier 208 is disposed above the tier 206, wherein each tier includes a first dummy layer and a second dummy layer. The tier 204 includes first dummy layer 204-1 and second dummy later 204-2; the tier 206 includes first dummy layer 206-1 and second dummy later 206-2; and tier 208 includes first dummy layer 208-1 and second dummy later 208-2. In some embodiments, the second dummy layer 208-2 of the tier 208 is exposed, and the first dummy layer 204-1 of the first tier 204 is in direct contact with an upper boundary 202U of the substrate 202. Accordingly, the tiers 208 and 204 are herein referred to as the topmost and bottommost tiers, respectively.

In some embodiments, the first dummy layers 204-1, 206-1, and 208-1 may be each a thin film comprising silicon oxide formed, for example, using a thermal oxidation process. In some embodiments, the first dummy layers 204-1, 206-1, and 208-1 may each act as an adhesion layer between adjacent layers, for example, the first dummy layer 204-1 serving as an adhesion layer between the substrate 202 and the second dummy layer 204-2. Further, the first dummy layer 204-1, 206-1, and 208-1 may also each act as an etch stop layer while etching the respective second dummy layer formed thereon. In some embodiments, the second dummy layers 204-2, 206-2, and 208-2 are each formed of silicon nitride, for example, using low-pressure chemical vapor deposition (LPCVD) or plasma enhanced chemical vapor deposition (PECVD). In some embodiments, the second dummy layers 204-2, 206-2, and 208-2 are each used as a hard mask during subsequent photolithography processes.

Figure 2C:
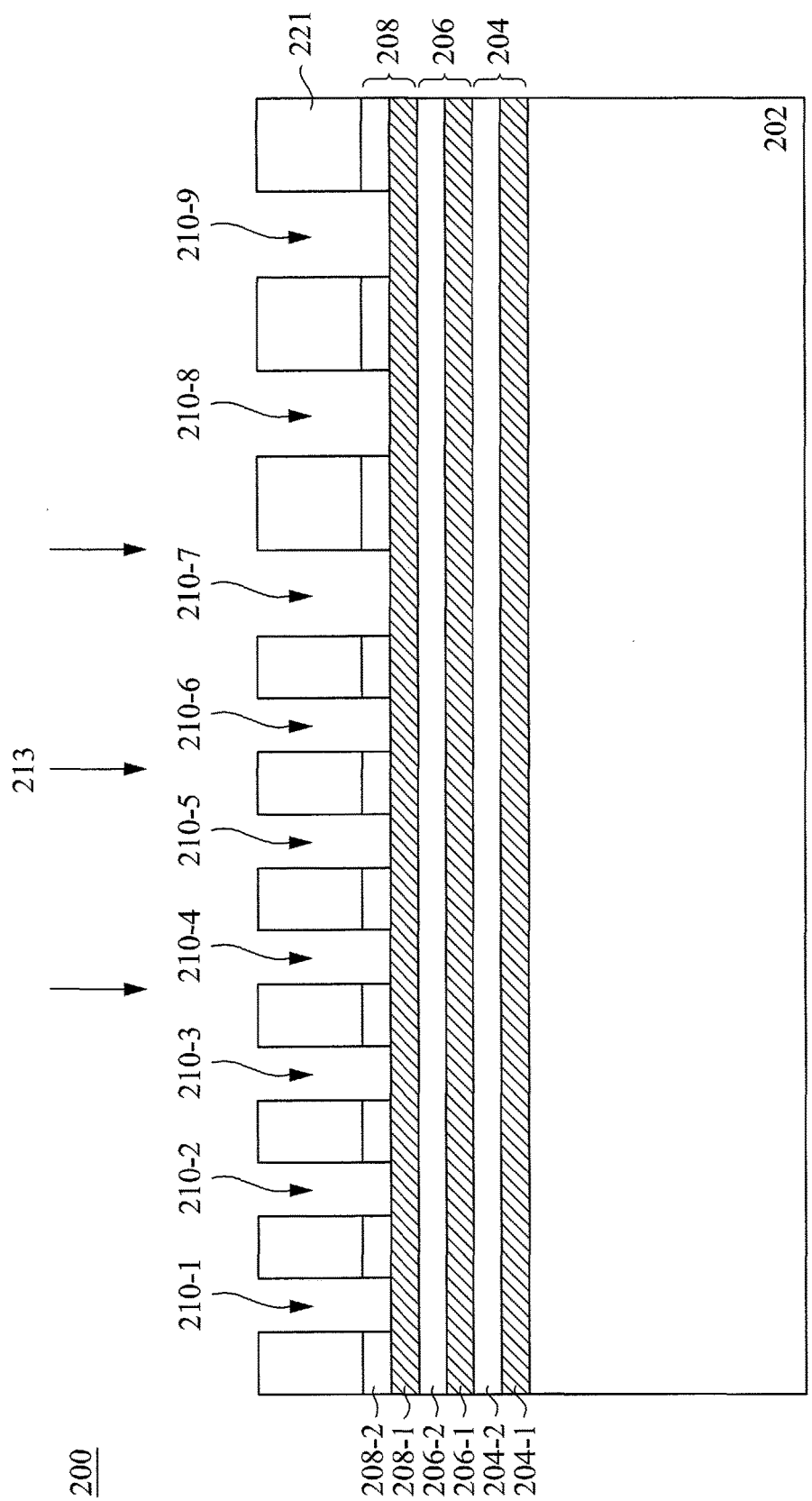

Corresponding to operation 106 of FIG. 1A, FIG. 2C is a cross-sectional view of the photonic device 200 including a plurality of first recessed regions 210-1, 210-2, 210-3, 210-4, 210-5, 210-6, 210-7, 210-8, and 210-9, which are formed at one of the various stages of fabrication, according to some embodiments. Although in the illustrated embodiments of FIG. 2C (and the following figures), there are nine first recessed regions 210-1 to 210-9 are shown, it is understood that any desired number of first recessed regions can be formed while remaining within the scope of the present disclosure. Further, although in the illustrated embodiments of FIG. 2C (and the following figures), the first recessed regions 210-1 to 210-9 are formed as being next to one another on the substrate 202, it is understood that the first recessed regions 210-1 to 210-9 can be divided into plural subgroups that are laterally spaced apart from one another and/or separated apart from one another by one or more devices on the substrate 202 while remaining within the scope of the present disclosure.

The plurality of first recessed regions 210-1 to 210-9 are formed by at least: forming a patterned layer (e.g., a photoresist layer) 211 over the topmost tier 208 to cover respective portions of the second dummy layer 208-2 at the topmost tier 208; and performing an anisotropic etching process (e.g., a reactive ion etching process) 213 on the second dummy layer 208-2 of the topmost tier 208 while using the patterned layer 211 as a mask. As mentioned above, the first dummy layers of the tiers 204, 206, and 208 each provides an etch stop function, such that the etching process 213 may stop at the first dummy layer 208-1, in accordance with some embodiments. Accordingly, the plurality of first recessed regions 210-1 to 210-9 each exposes a respective portion of the first dummy layer 208-1 at the topmost tier 208.

Figure 2D:
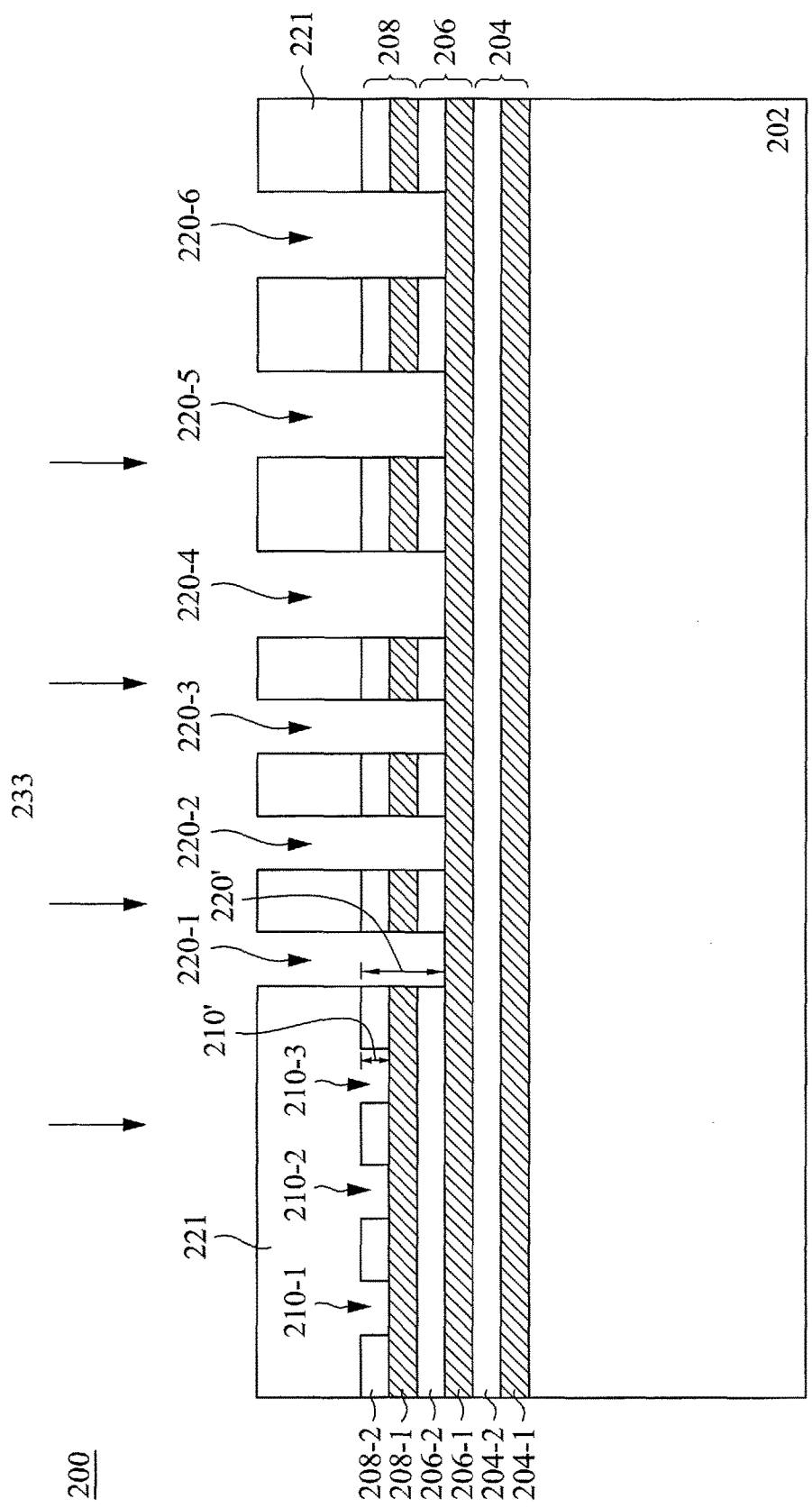

Corresponding to operation 108 of FIG. 1A, FIG. 2D is a cross-sectional view of the photonic device 200 including a plurality of second recessed regions 220-1, 220-2, 220-3, 220-4, 220-5, and 220-6, which are formed at one of the various stages of fabrication, according to some embodiments. The plurality of second recessed regions 220-1 to 220-6 are formed by at least: forming a patterned layer (e.g., a photoresist layer) 221 over the topmost tier 208 to cover the first recessed regions 210-1 to 210-3 and the remaining portions of the second dummy layer 208-2; and performing an anisotropic etching process 223 on the second dummy layer 206-2 of the next lower tier, i.e., 206, while using the patterned layer 221 as a mask. As mentioned above, the first dummy layers of the tiers 204, 206, and 208 each provides an etch stop function, such that the etching process 223 may stop at the first dummy layer 206-1, in accordance with some embodiments. Accordingly, the plurality of second recessed regions 220-1 to 220-6 each exposes a respective portion of the first dummy layer at the tier 206.

Since the first recessed regions 210-1 to 210-3 are covered by the patterned layer 221 during the etching process 223, the first recessed regions 210-1 to 210-3 may remain substantially intact and other first recessed regions 210-4 to 210-9 (FIG. 2C) may further extend toward the substrate 202 to form the second recessed regions 220-1 to 220-6, respectively. As such, the first recessed regions 210-1 to 210-3 present a first depth 210' by extending through one second dummy layer 208-2; and the second recessed regions 220-1 to 220-6 present a second depth 220' by extending through two second dummy layers 208-2 and 206-2, and one first dummy layer 208-1, wherein the second depth 220' is substantially greater than the first depth 210'. Although the patterned layer 221 covers three first recessed regions 210-1 to 210-3 in the illustrated embodiments of FIG. 2D (and the following figures), it is understood that any desired number of first recessed regions can be covered while remaining within the scope of the present disclosure.

Figure 2E:
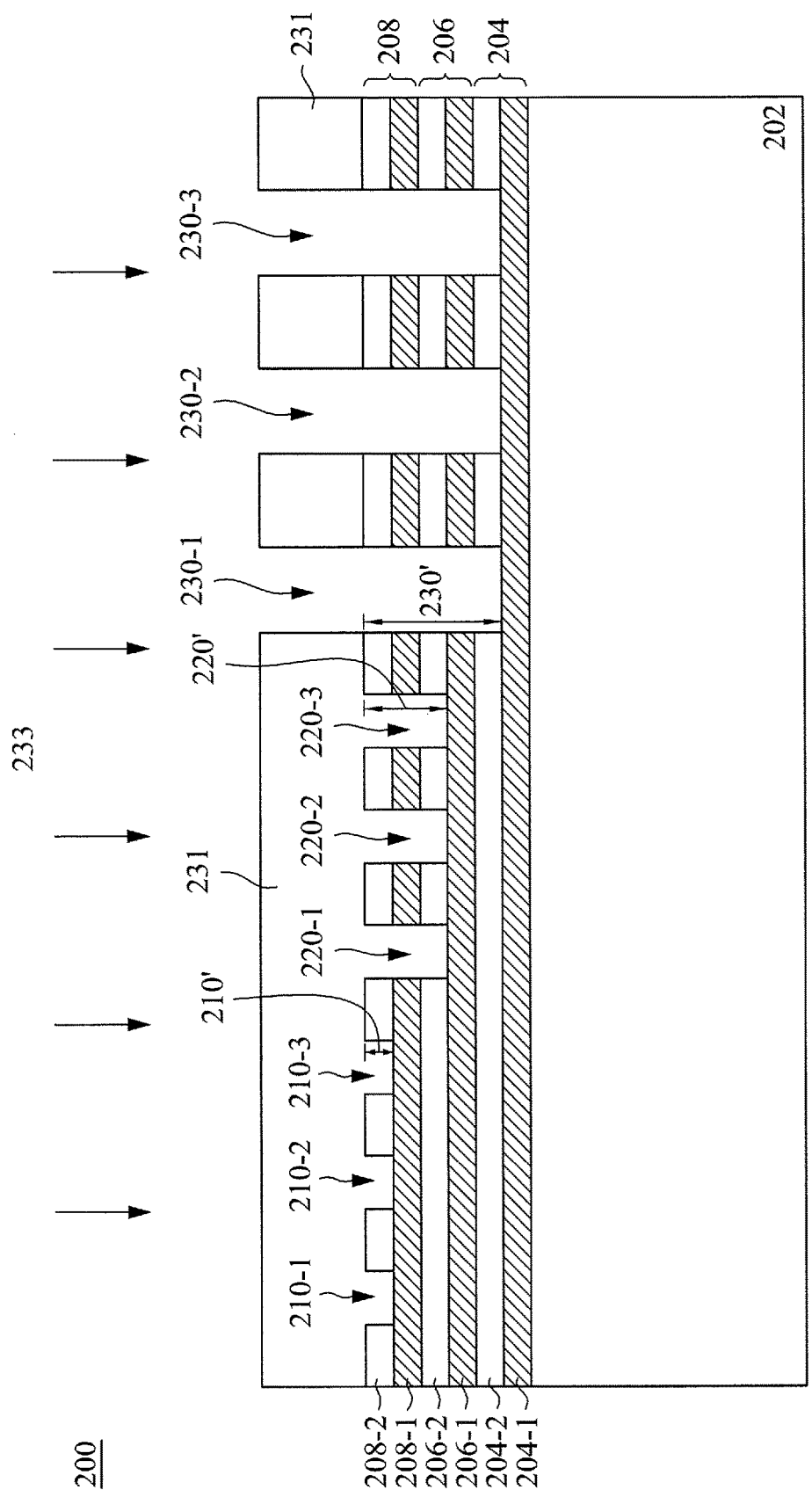

Corresponding to operation 110 of FIG. 1A, FIG. 2E is a cross-sectional view of the photonic device 200 including a plurality of third recessed regions 230-1, 230-2, and 230-3, which are formed at one of the various stages of fabrication, according to some embodiments. In some embodiments, since no portion of the first dummy layer 204-1 at the bottommost tier 204 is exposed after exposing the portions of the first dummy layer 206-1 at the tier 206 (FIG. 2D), at least a further exposing operation is performed by forming the third recessed regions 230-1 to 230-3.

In some embodiments, the plurality of third recessed regions 230-1 to 230-3 are formed by at least: forming a patterned layer (e.g., a photoresist layer) 231 over the topmost tier 208 to cover the first recessed regions 210-1 to 210-3, the second recessed regions 220-1 to 220-3, and the remaining portions of the second dummy layer 208-2; and performing an anisotropic etching process (e.g., a reactive ion etching process) 233 on the second dummy layer 204-2 of the next lower tier, i.e., 204, while using the patterned layer 231 as a mask. As mentioned above, the first dummy layers of the tiers 204, 206, and 208 each provides an etch stop function, such that the etching process 233 may stop at the first dummy layer 204-1, in accordance with some embodiments. Accordingly, the plurality of third recessed regions 230-1 to 230-3 each exposes a respective portion of the first dummy layer at the bottommost tier 204.

Since the first recessed regions 210-1 to 210-3 and second recessed regions 220-1 to 220-3 are covered by the patterned layer 221 during the etching process 233, the first recessed regions 210-1 to 210-3 and second recessed regions 220-1 to 220-3 may remain substantially intact and other second recessed regions 220-4 to 220-6 (FIG. 2D) may further extend toward the substrate 202 to form the third recessed regions 230-1 to 230-3, respectively. As such, the third recessed regions 230-1 to 230-3 present a third depth 230' by extending through three second dummy layers 208-2, 206-2 and 204-2, and two first dummy layer 208-1 and 206-1, wherein the third depth 230' is substantially greater than the first and second depths 210' and 220'. Although the patterned layer 231 covers three first recessed regions 210-1 to 210-3 and three second recessed regions 220-1 to 220-3 in the illustrated embodiments of FIG. 2E (and the following figures), it is understood that any desired number of first and second recessed regions can be covered while remaining within the scope of the present disclosure.

Figure 2F:
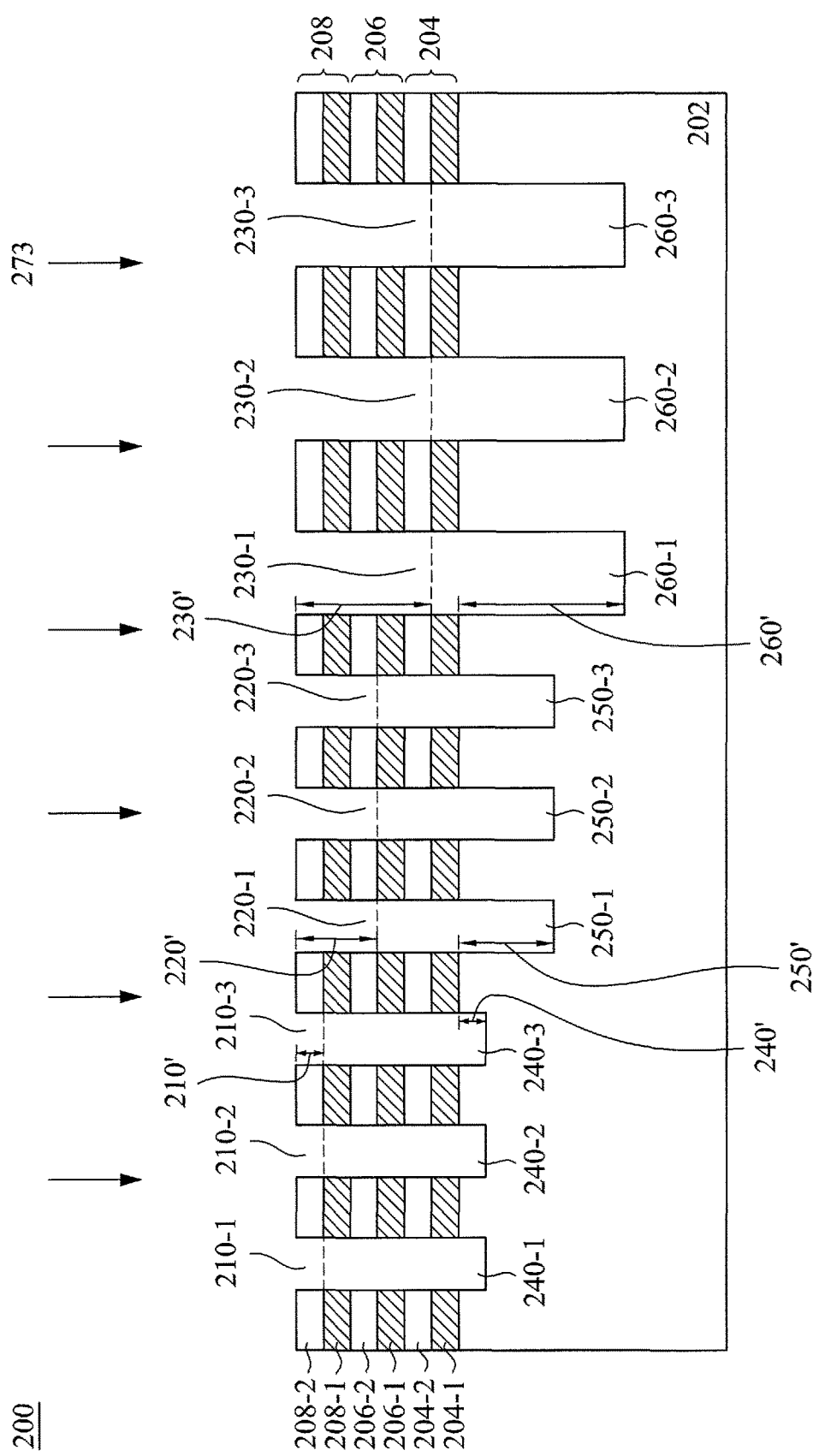

Corresponding to operation 112 of FIG. 1A, FIG. 2F is a cross-sectional view of the photonic device 200 including a first set of trenches 240-1, 240-2, and 240-3, a second set of trenches 250-1, 250-2, and 250-3, and a third set of trenches 260-1, 260-2, and 260-3 over the substrate 202, which are formed at one of the various stages of fabrication, according to some embodiments. The first, second, and third sets of trenches 240-1 to 240-3, 250-1 to 250-3, and 260-1 to 260-3 are formed by at least: removing the patterned layer 231 (FIG. 2E); and performing an anisotropic etching process (e.g., a reactive ion etching process) 273 on the substrate 202 while using the remaining first and second dummy layers across the tiers 204, 206, and 208 as a mask.

More specifically, after removing the patterned layer 231, the remaining first and second dummy layers across the tiers 204, 206, and 208 collectively present various sets of recessed regions 210-1 to 210-3, 220-1 to 220-3, and 230-1 to 230-3 (shown in dotted lines in FIG. 2F), wherein each set has a respective different depth 210', 220' or 230', or respective different numbers of first and/or second dummy layers that each set of recessed regions extend through. Alternatively stated, different numbers of first and/or second dummy layers are disposed below the various sets of recessed regions 210-1 to 210-3, 220-1 to 220-3, and 230-1 to 230-3. As such, during the etching process 273, respective portions of the substrate 202 below the various recessed regions 210-1 to 210-3, 220-1 to 220-3, and 230-1 to 230-3 may receive etching ions with different energies so that the first, second, and third sets of trenches 240-1 to 240-3, 250-1 to 250-3, and 260-1 to 260-3, which are respectively formed by etching through the sets of recessed regions 210-1 to 210-3, 220-1 to 220-3, and 230-1 to 230-3, can present respective different depths 240', 250', and 260'.

Thus, it can be understood that the number of tiers (3 in the illustrated example of the semiconductor device 200) corresponds to the number of different depths (also 3 in the current example) by which the trenches 240-1 to 240-3, 250-1 to 250-3, and 260-1 to 260-3 extend into the substrate 202, as discussed above. And the depth of the recessed region (e.g., 210-1 to 210-3, 220-1 to 220-3, and 230-1 to 230-3), the number of first and/or second dummy layers that each recessed region extends through, or the number of first and/or second dummy layers disposed below each recessed region corresponds to the depth of a corresponding trench (e.g., 240-1 to 240-3, 250-1 to 250-3, and 260-1 to 260-3) formed in the substrate 202, in accordance with some embodiments of the present disclosure.

Figure 2G:
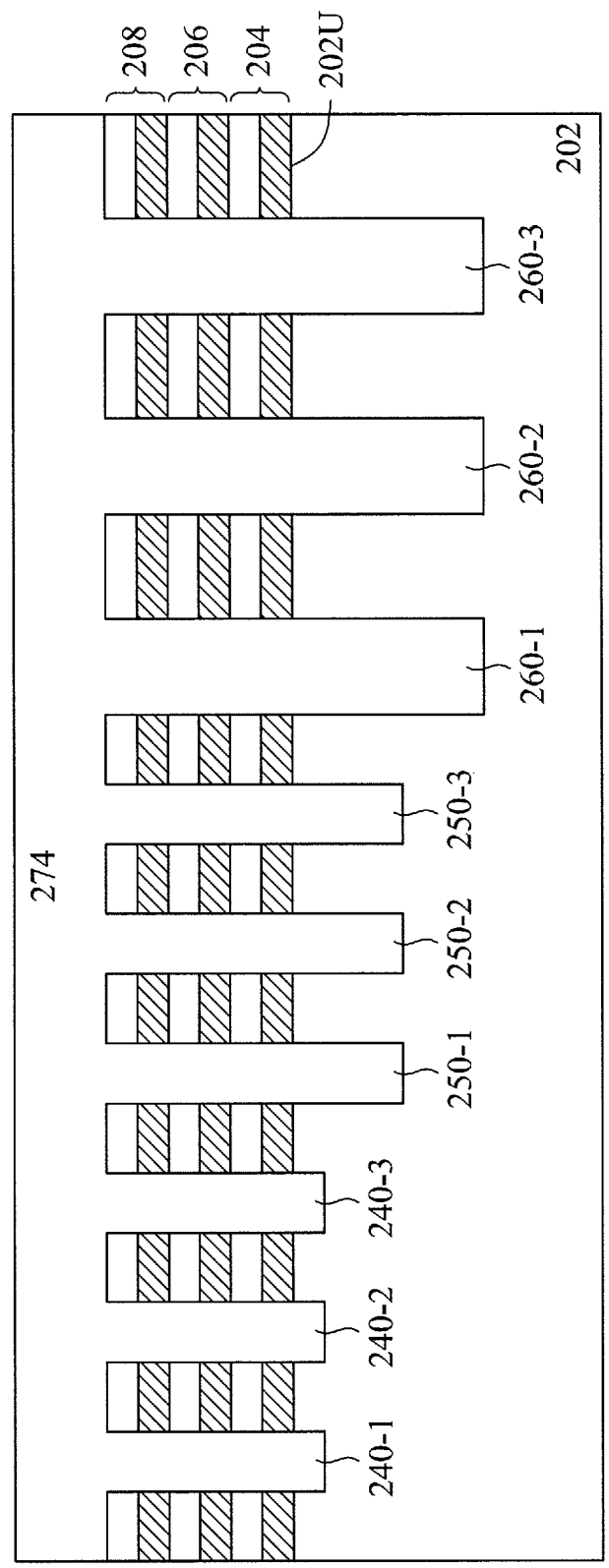

Corresponding to operation 114 of FIG. 1B, FIG. 2G is a cross-sectional view of the photonic device 200 including a dielectric material 274, which is formed at one of the various stages of fabrication, according to some embodiments. As shown, the dielectric material 274 is formed over the substrate 202 (and the remaining first and second dummy layers across the tiers 204, 206, and 208) to fill the first, second, and third sets of trenches 240-1 to 240-3, 250-1 to 250-3, and 260-1 to 260-3, respectively.

In some embodiments, the dielectric material 274 may include a material that is selected from at least one of: silicon oxide (SiO), silicon nitride (SiN), silicon oxynitride (SiON), a low dielectric constant (low-k) material, a high dielectric constant (high-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. The high-k material may include one or more of the following: $AlO_x$, $LaAlO_3$, $HfAlO_3$, $Pr_2O_3$-based lanthanide oxide, HfSiON, Zr—Sn—Ti—O, ZrON, $HFO_2$/Hf, $ZrAl_xO_Y$, $ZrTiO_4$, Zr-doped Ta oxide, $HfO_2$—$Si_3N_4$, lanthanide oxide, $TiAlO_x$, $LaAlO_x$, $La_2Hf_2O_7$, HfTaO amorphous lanthanide doped $TiO_x$, $TiO_2$, $HfO_2$, $CrTiO_3$, $ZrO_2$, $Y_2O_3$, $Gd_2O_3$, praseodymium oxide, amorphous $ZrO_xN_Y$, Y—Si—O, $LaAlO_3$, amorphous lanthanide-doped $TiO_x$, $HfO_2/La_2O_3$ nanolaminates, $La_2O_3/Hf_2O_3$ nanolaminates, $HfO_2/ZrO_2$ nanolaminates, lanthanide oxide/zirconium oxide nanolaminates, lanthanide oxide/hafnium oxide nanolaminates, $TiO_2/CeO_2$ nanolaminates, $PrO_x/ZrO_2$ nanolaminates, $Hf_3N_4/HfO_2$ nanolaminates, and $Zr_3N_4/ZrO_2$ nanolaminates.

Corresponding to operation 116 of FIG. 1B, FIG. 2H is a cross-sectional view of the photonic device 200 including a first set of grating structures 280-1, 280-2, and 280-3, a second set of grating structures 282-1, 282-2, and 282-3, and a third set of grating structures 284-1, 284-2, and 284-3, which are formed at one of the various stages of fabrication, according to some embodiments. The first, second, and third sets of grating structures 280-1 to 280-3, 282-1 to 282-3, and 284-1 to 284-3 are formed at least by: performing a polishing process (e.g., a chemical mechanical polishing (CMP) process) on the dielectric material 274 formed above the upper boundary 202U of the substrate 202 and the remaining first and second dummy layers across the tiers 204, 206, and 208 (FIG. 2G); and performing a wet etching process to remove any remaining first and second dummy layers of the tiers 204, 206, and 208.

In some embodiments, the first set of grating structures 280-1 to 280-3, each extending into the substrate 202 with the depth 240', collectively form a first comb-like structure 280; the second set of grating structures 282-1 to 282-3, each extending into the substrate 202 with the depth 250', collectively form a second comb-like structure 282; and the third set of grating structures 284-1 to 284-3, each extending into the substrate 202 with the depth 260', collectively form a third comb-like structure 284.

As mentioned above with respect to FIG. 2C, the disclosed photonic device 200 can include any desired number of first recessed regions, e.g., 210-1 to 210-9. And the first recessed regions are subsequently used to form the second recessed regions (e.g., 220-1 to 2203-3) and then the third recessed regions (e.g., 230-1 to 230-3), which allow the grating structures 280-1 to 280-3, 282-1 to 282-3, and 284-1 to 284-3 to be formed, respectively. Further, during the respective formation steps of the second and third recessed regions, any desired numbers of second and third recessed regions can also be formed. Thus, it is understood that the first, second, and third comb-like structures 280, 282, and 284 can each include any desired number of grating structures that share a substantially similar depth, i.e., any desired number of grating structures that are periodically arranged.

Figure 3A:
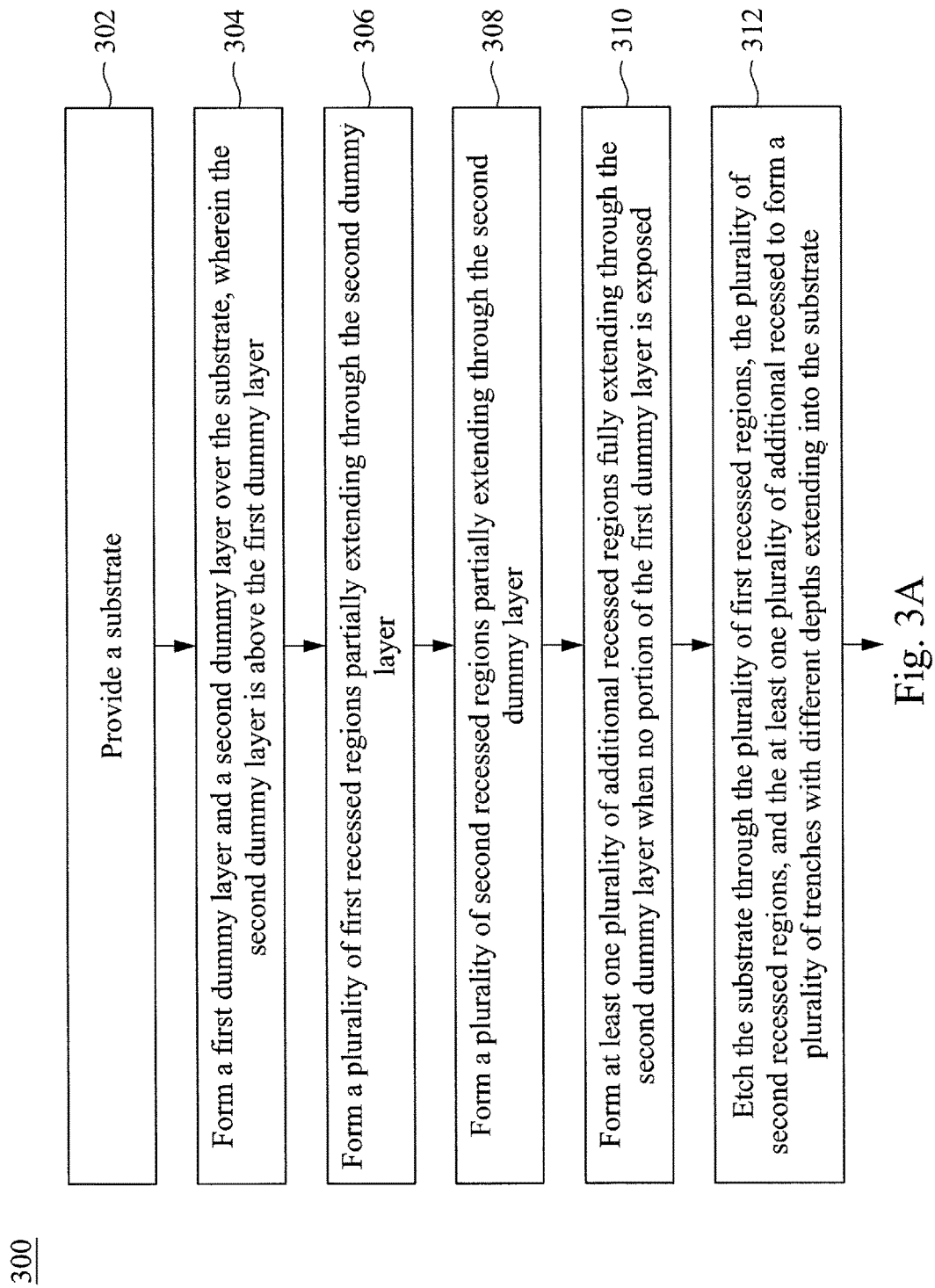
FIGS. 3A and 3B illustrate a flow chart of another exemplary method for forming a semiconductor device, in accordance with some embodiments.
Figure 3B:
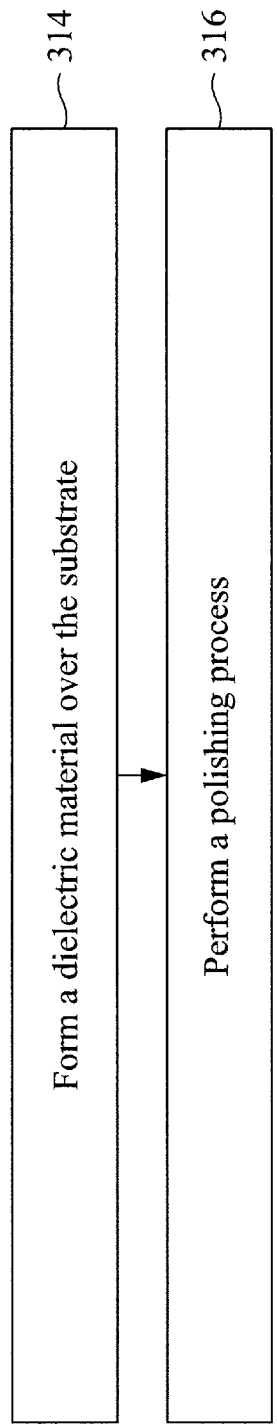

FIGS. 3A and 3B collectively illustrate a flowchart of another method 300 to form a semiconductor device according to one or more embodiments of the present disclosure. It is noted that the method 300 is merely an example, and is not intended to limit the present disclosure. In some embodiments, the semiconductor device is, at least part of, a photonic device. As employed by the present disclosure, the photonic device refers to any device configured to process (e.g., receive, reflect, diffract, transmit, etc.) an optical signal. It is noted that the method 300 of FIGS. 3A-3B does not produce a completed photonic device. A completed photonic device may be fabricated using complementary metal-oxide-semiconductor (CMOS) technology processing. Accordingly, it is understood that additional operations may be provided before, during, and after the method 300 of FIGS. 3A-3B, and that some other operations may only be briefly described herein.

Referring first to FIG. 3A, in some embodiments, the method 300 starts with operation 302 in which a substrate is provided. The method 300 continues to operation 304 in which a first dummy layer and a second dummy layer are formed over the substrate, wherein the second dummy layer is above the first dummy layer. The method 300 continues to operation 306 in which a plurality of first recessed regions that each partially extends through the second dummy layer are formed. In some embodiments, the plurality of first recessed regions share a substantially similar first depth (i.e., extending into the second dummy layer with the substantially similar first depth). The method 300 continues to operation 308 in which a plurality of second recessed regions that each partially extends through the second dummy layer are formed. In some embodiments, the plurality of second recessed regions are formed by further extending a subgroup of the plurality of first recessed regions into the second dummy layer and share a substantially similar second depth (i.e., extending into the second dummy layer with the substantially similar second depth).

Next, the method 300 continues to operation 310 in which when no portion of the first dummy layer is exposed, at least one plurality of additional recessed regions that each fully extends through the second dummy layer are formed. In some embodiments, the at least one plurality of additional recessed regions are formed by further extending a subgroup of the plurality of second recessed regions into the second dummy layer to expose corresponding portions of the first dummy layer. In some embodiments, the additional recessed regions share a substantially similar third depth (i.e., extending into the second dummy layer with the substantially similar third depth). The method 300 continues to operation 312 in which the substrate is etched through the plurality of first recessed regions, the plurality of second recessed regions, and the at least one plurality of additional recessed regions to form a plurality of trenches with different depths extending into the substrate. Similar as operation 112 of the method 100 of FIG. 1A, in some embodiments, since the etching process includes an anisotropic etching process and the respective recessed regions have different depths, the etching process can produce the plurality of trenches with different depths extending into the substrate while using the remaining second dummy layer as a mask.

Referring then to FIG. 1B, the method 300 continues to operation 314 in which a dielectric material is formed over the substrate. In some embodiments, the dielectric material is formed to fill the plurality of trenches that have different depths. The method 300 continues to operation 316 in which a polishing process is performed. In some embodiments, the polishing process (e.g., a chemical mechanical polishing (CMP) process) is performed to remove any excessive dielectric material formed above an upper boundary of the substrate and the remaining portions of the first and second dummy layers.

In some embodiments, operations of the method 300 may be associated with cross-sectional views of a semiconductor device 300 at various fabrication stages as shown in FIGS. 3A, 3B, 3C, 3D, 3E, 3F, 3G, and 3H, respectively. In some embodiments, the semiconductor device 300 may be a photonic device. The photonic device 300 may be included in a microprocessor, and/or other integrated circuit (IC). Also, FIGS. 3A through 3H are simplified for a better understanding of the concepts of the present disclosure. For example, although the figures illustrate the photonic device 300, it is understood the IC, in which the photonic device 300 is formed, may include a number of other devices such as, for example, a photodiode, a laser diode, an optical modulator, etc., which are not shown in FIGS. 3A through 3H, for purposes of clarity of illustration.

Figure 4A:
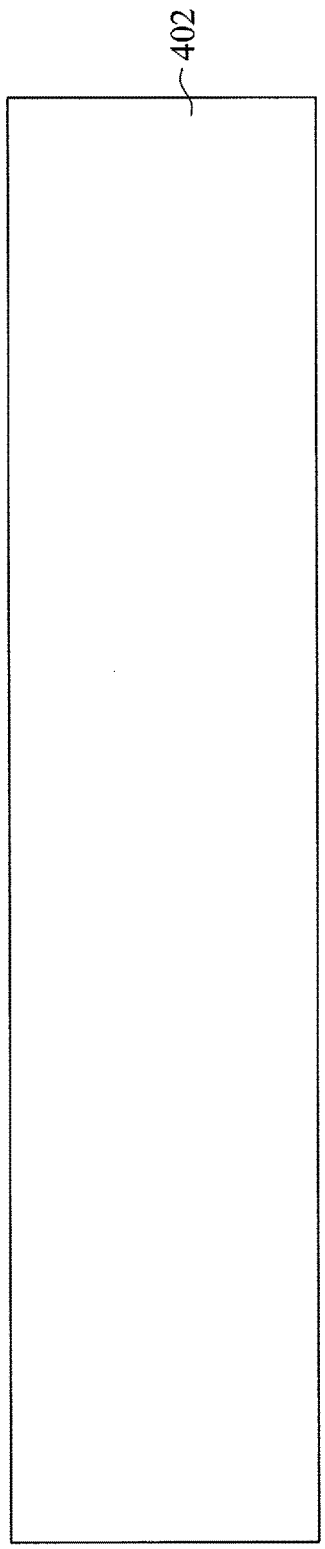
FIGS. 4A, 4B, 4C, 4D, 4E, 4F, 4G, and 4H illustrate cross-sectional views of an exemplary semiconductor device during various fabrication stages, made by the method of FIG. 3, in accordance with some embodiments.

Corresponding to operation 302 of FIG. 3A, FIG. 4A is a cross-sectional view of the photonic device 400 including a substrate 402, which is provided at one of the various stages of fabrication, according to some embodiments. In some embodiments, the substrate 402 includes a semiconductor material substrate, for example, silicon. Alternatively, the substrate 402 may include other elementary semiconductor material such as, for example, germanium. The substrate 402 may also include a compound semiconductor such as silicon carbide, gallium arsenic, indium arsenide, and indium phosphide. The substrate 402 may include an alloy semiconductor such as silicon germanium, silicon germanium carbide, gallium arsenic phosphide, and gallium indium phosphide. In one embodiment, the substrate 402 includes an epitaxial layer. For example, the substrate 402 may have an epitaxial layer overlying a bulk semiconductor. Furthermore, the substrate 402 may include a semiconductor-on-insulator (SOI) structure. For example, the substrate may include a buried oxide (BOX) layer formed by a process such as separation by implanted oxygen (SIMOX) or other suitable technique, such as wafer bonding and grinding. In some other embodiments, the substrate 402 may include sapphire.

Figure 4B:
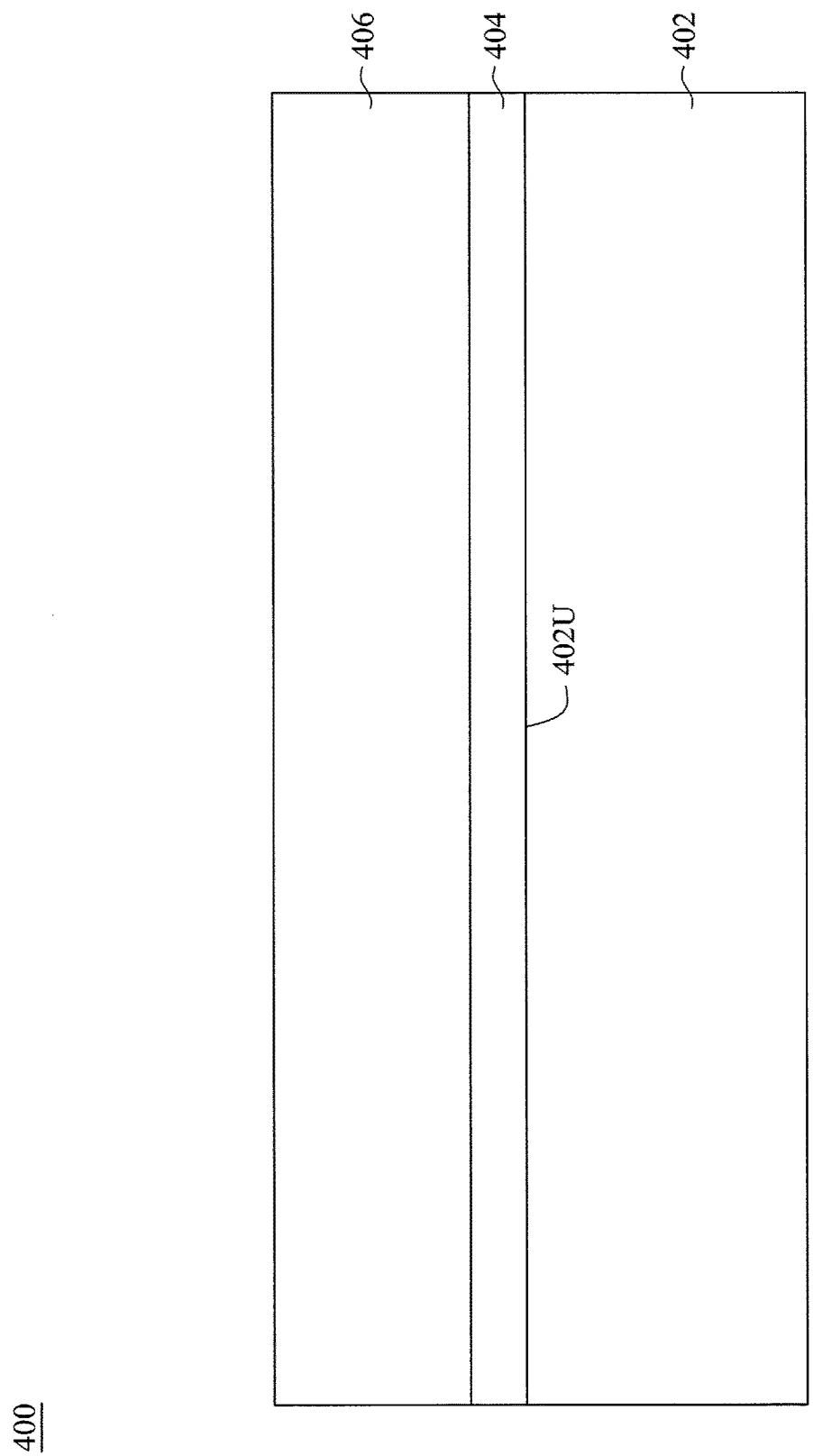

Corresponding to operation 304 of FIG. 3A, FIG. 4B is a cross-sectional view of the photonic device 400 including a first dummy layer 404 and a second dummy layer 406, which are formed at one of the various stages of fabrication, according to some embodiments. As shown, the first dummy layer 404 is formed over the substrate 402, and the second dummy layer 406 is formed over the first dummy layer 404. In some embodiments, the first dummy layer 404 may be in direct contact with the substrate 402, i.e., directly contacting an upper boundary 402U of the substrate 402.

In some embodiments, the first dummy layer 404 may be a thin film comprising silicon oxide formed, for example, using a thermal oxidation process. In some embodiments, the first dummy layer 404 may act as an adhesion layer between adjacent layers, for example, the first dummy layer 404 serving as an adhesion layer between the substrate 402 and the second dummy layer 406. Further, the first dummy layer 404 may also act as an etch stop layer while etching the layer(s) formed thereon, e.g., the second dummy layer 406. In some embodiments, the second dummy layer 406 is formed of silicon nitride, for example, using low-pressure chemical vapor deposition (LPCVD) or plasma enhanced chemical vapor deposition (PECVD). In some embodiments, the second dummy layer 406 is used as a hard mask during subsequent photolithography processes.

Figure 4C:
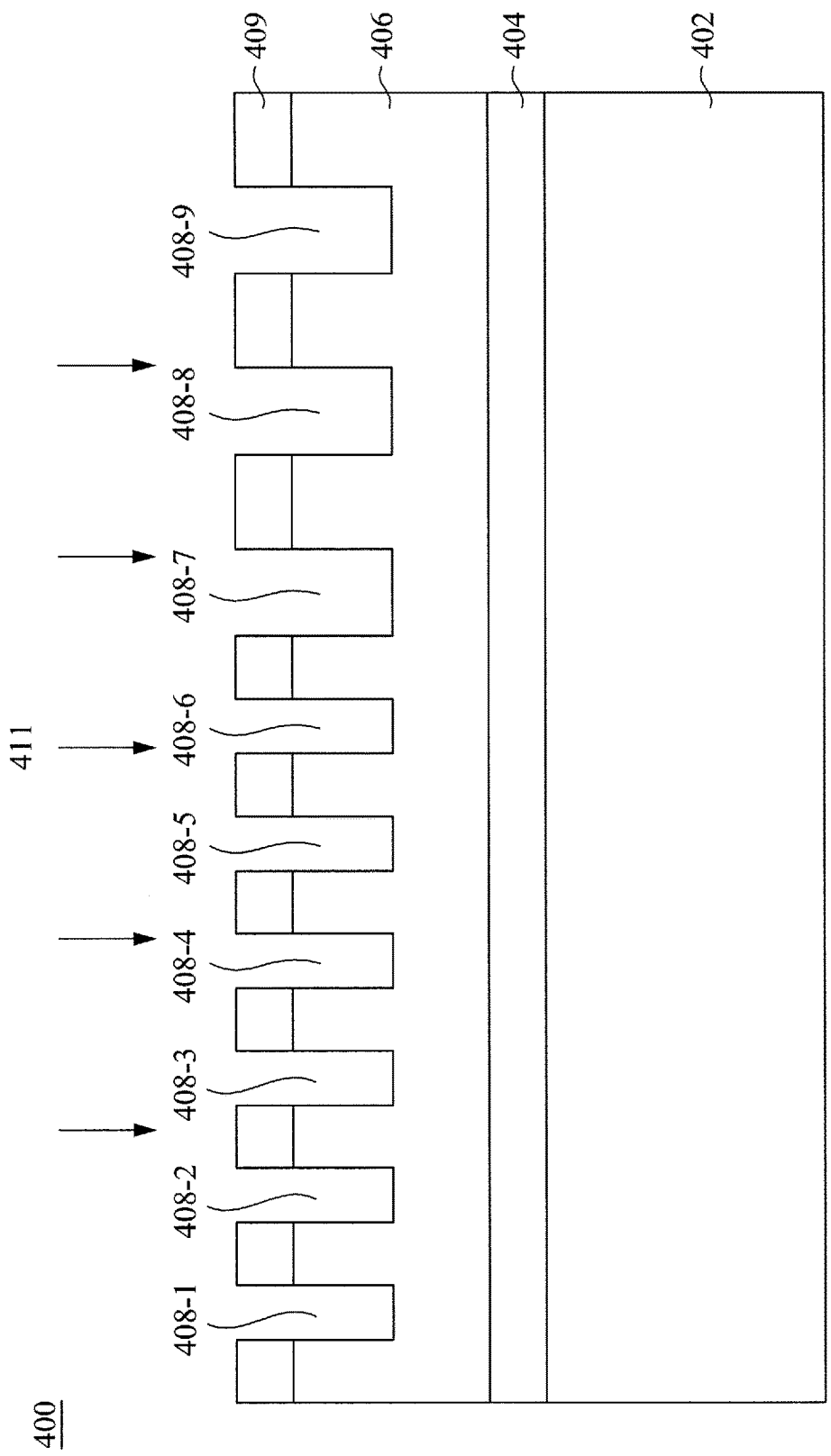

Corresponding to operation 306 of FIG. 3A, FIG. 4C is a cross-sectional view of the photonic device 400 including a plurality of first recessed regions 408-1, 408-2, 408-3, 408-4, 408-5, 408-6, 408-7, 408-8, and 408-9, which are formed at one of the various stages of fabrication, according to some embodiments. Although in the illustrated embodiments of FIG. 4C (and the following figures), there are nine first recessed regions 408-1 to 408-9 are shown, it is understood that any desired number of first recessed regions can be formed while remaining within the scope of the present disclosure. Further, although in the illustrated embodiments of FIG. 2C (and the following figures), the first recessed regions 408-1 to 408-9 are formed as being next to one another on the substrate 402, it is understood that the first recessed regions 408-1 to 408-9 can be divided into plural subgroups that are laterally spaced apart from one another and/or separated apart from one another by one or more devices on the substrate 402 while remaining within the scope of the present disclosure.

The plurality of first recessed regions 408-1 to 408-9 are formed by at least: forming a patterned layer (e.g., a photoresist layer) 409 over the second dummy layer 406 to cover respective portions of the second dummy layer 406; and performing an anisotropic etching process (e.g., a reactive ion etching process) 411 on the second dummy layer 406 while using the patterned layer 409 as a mask. In some embodiments, the etching process 411 may be controlled by a time duration of the etching process 411. As such, the etching process 411 may be stopped based on a pre-determined time duration.

Figure 4D:
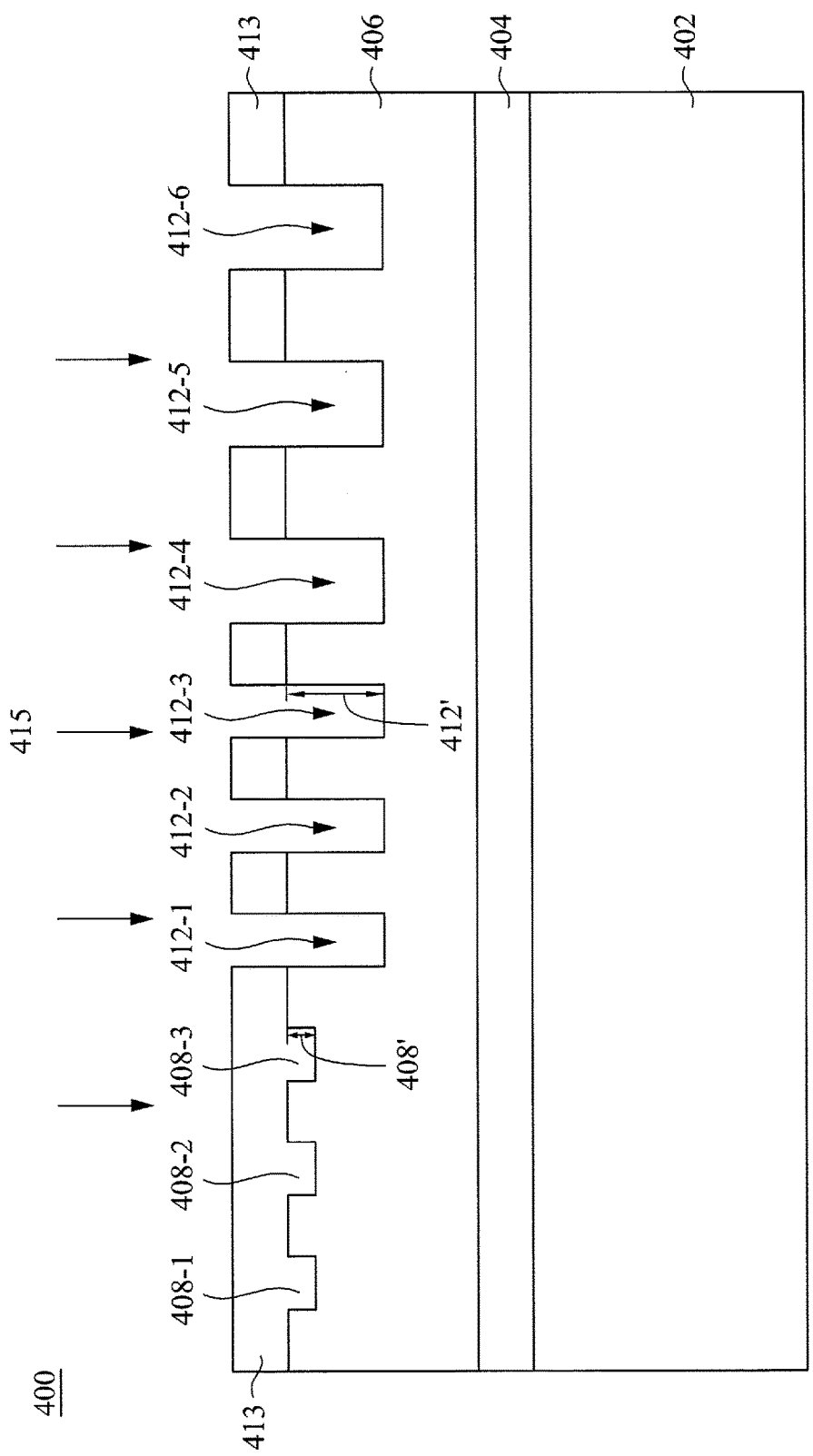

Corresponding to operation 308 of FIG. 3A, FIG. 4D is a cross-sectional view of the photonic device 400 including a plurality of second recessed regions 412-1, 412-2, 412-3, 412-4, 412-5, and 412-6, which are formed at one of the various stages of fabrication, according to some embodiments. The plurality of second recessed regions 412-1 to 412-6 are formed by at least: forming a patterned layer (e.g., a photoresist layer) 413 over the second dummy layer 406 to cover the first recessed regions 408-1 to 408-3 and the remaining portions of the second dummy layer 406; and performing an anisotropic etching process 415 on the second dummy layer 406 while using the patterned layer 413 as a mask. In some embodiments, similar as the etching process 411, the etching process 415 may be controlled by a time duration of the etching process 415. As such, the etching process 415 may be stopped based on a pre-determined time duration.

Since the first recessed regions 408-1 to 408-3 are covered by the patterned layer 413 during the etching process 415, the first recessed regions 408-1 to 408-3 may remain substantially intact and other first recessed regions 408-4 to 408-9 (FIG. 4C) may further extend toward the substrate 402 to form the second recessed regions 412-1 to 412-6, respectively. As such, the first recessed regions 408-1 to 408-3 present a first depth 408'; and the second recessed regions 412-1 to 412-6 present a second depth 412', wherein the second depth 412' is substantially greater than the first depth 408'. Although the patterned layer 413 covers three first recessed regions 408-1 to 408-3 in the illustrated embodiments of FIG. 4D (and the following figures), it is understood that any desired number of first recessed regions can be covered while remaining within the scope of the present disclosure.

Figure 4E:
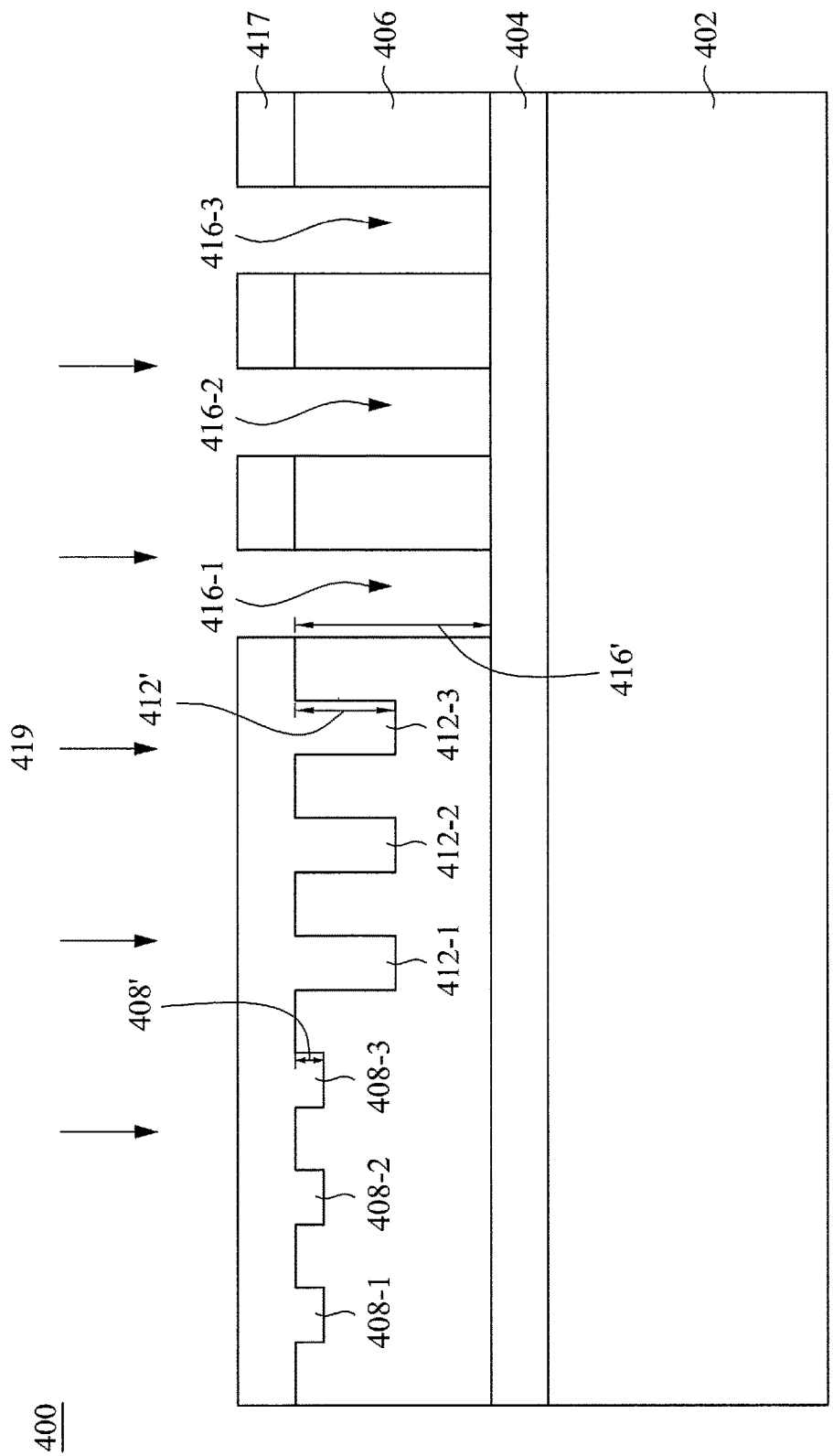

Corresponding to operation 310 of FIG. 3A, FIG. 4E is a cross-sectional view of the photonic device 400 including a plurality of third recessed regions 416-1, 416-2, and 416-3, which are formed at one of the various stages of fabrication, according to some embodiments. In some embodiments, since no portion of the first dummy layer 404 is exposed after forming the second recessed regions 412-1 to 412-6 (FIG. 4D), at least a further etching operation is performed to form the third recessed regions 416-1 to 416-3.

In some embodiments, the plurality of third recessed regions 416-1 to 416-3 are formed by at least: forming a patterned layer (e.g., a photoresist layer) 417 over the second dummy layer 406 to cover the first recessed regions 408-1 to 408-3, the second recessed regions 412-1 to 412-3, and the remaining portions of the second dummy layer 406; and performing an anisotropic etching process (e.g., a reactive ion etching process) 419 on the second dummy layer 406 while using the patterned layer 417 as a mask. As mentioned above, the first dummy layer 404 can provide an etch stop function, such that the etching process 419 may stop at the first dummy layer 404, in accordance with some embodiments. Accordingly, the plurality of third recessed regions 416-1 to 416-3 each exposes a respective portion of the first dummy layer 404.

Since the first recessed regions 408-1 to 408-3 and second recessed regions 412-1 to 412-3 are covered by the patterned layer 417 during the etching process 419, the first recessed regions 408-1 to 408-3 and second recessed regions 412-1 to 412-3 may remain substantially intact and other second recessed regions 412-4 to 412-6 (FIG. 4D) may further extend toward the substrate 402 to form the third recessed regions 416-1 to 416-3, respectively. As such, the third recessed regions 416-1 to 416-3 present a third depth 416', wherein the third depth 416' is substantially greater than the first and second depths 408' and 412'. Although the patterned layer 417 covers three first recessed regions 408-1 to 408-3 and three second recessed regions 412-1 to 412-3 in the illustrated embodiments of FIG. 4E (and the following figures), it is understood that any desired number of first and second recessed regions can be covered while remaining within the scope of the present disclosure.

Figure 4F:
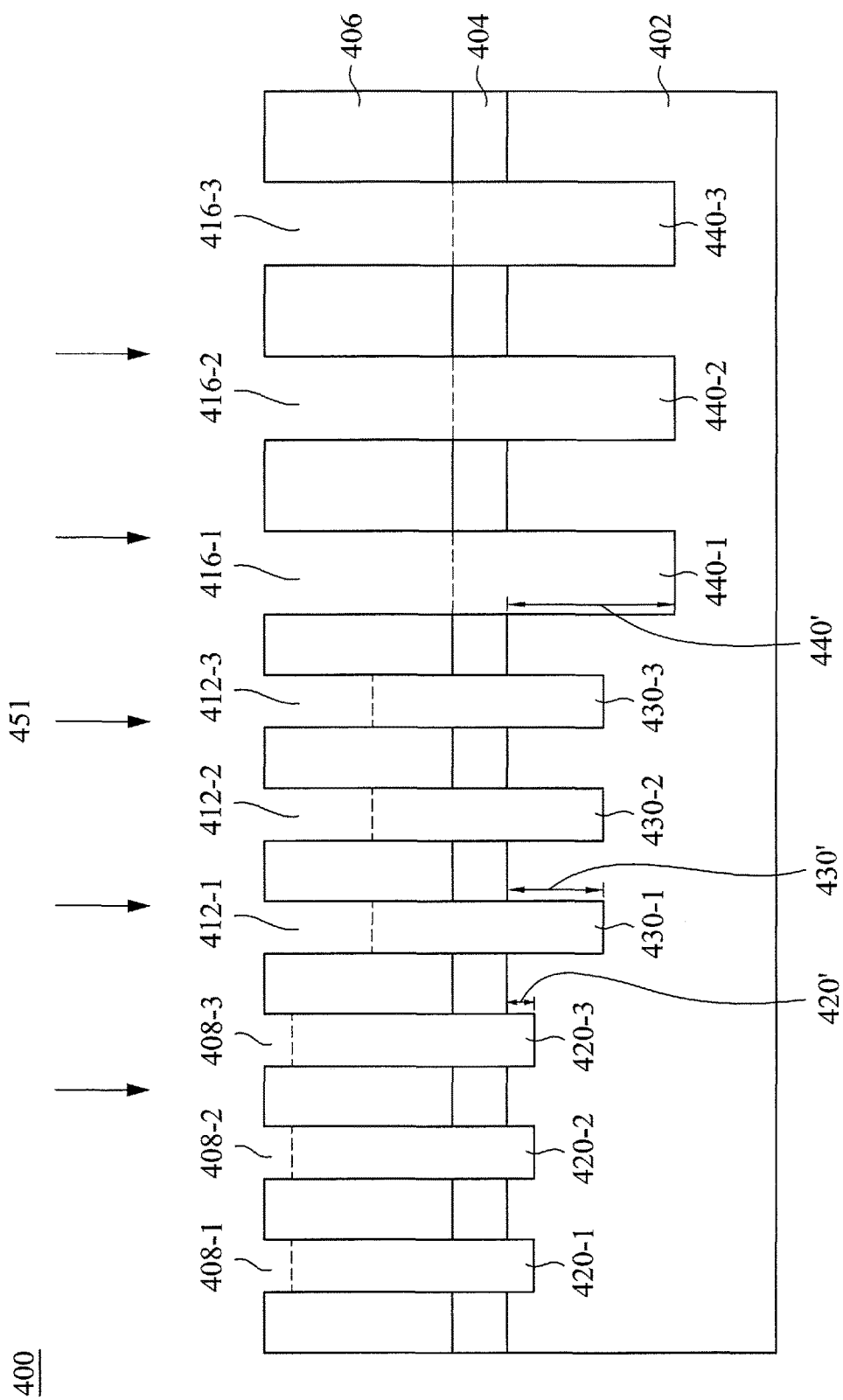

Corresponding to operation 312 of FIG. 3A, FIG. 4F is a cross-sectional view of the photonic device 400 including a first set of trenches 420-1, 240-2, and 420-3, a second set of trenches 430-1, 430-2, and 430-3, and a third set of trenches 440-1, 440-2, and 440-3 over the substrate 402, which are formed at one of the various stages of fabrication, according to some embodiments. The first, second, and third sets of trenches 420-1 to 420-3, 430-1 to 430-3, and 440-1 to 440-3 are formed by at least: removing the patterned layer 417 (FIG. 4E); and performing an anisotropic etching process (e.g., a reactive ion etching process) 451 on the substrate 402 while using the remaining second dummy layer 406 as a mask.

More specifically, after removing the patterned layer 417, the remaining second dummy layer 406 presents various sets of recessed regions 408-1 to 408-3, 412-1 to 412-3, and 416-1 to 416-3 (shown in dotted lines in FIG. 4F), wherein each set has a respective different depth 408', 412' or 416'. Alternatively stated, different thicknesses of the second dummy layer are disposed below the various sets of recessed regions 408-1 to 408-3, 412-1 to 412-3, and 416-1 to 416-3. As such, during the etching process 451, respective portions of the substrate 402 below the various recessed regions 408-1 to 408-3, 412-1 to 412-3, and 416-1 to 416-3 may receive etching ions with different energies so that the first, second, and third sets of trenches 420-1 to 420-3, 430-1 to 430-3, and 440-1 to 440-3, which are respectively formed by etching through the sets of recessed regions 408-1 to 408-3, 412-1 to 412-3, and 416-1 to 416-3, can present respective different depths 420', 430', and 440'.

Thus, it can be understood that the depth of the recessed region (e.g., 408-1 to 408-3, 412-1 to 412-3, and 416-1 to 416-3) corresponds to the depth of a corresponding trench (e.g., 420-1 to 420-3, 430-1 to 430-3, and 440-1 to 440-3) formed in the substrate 402, in accordance with some embodiments of the present disclosure.

Figure 4G:
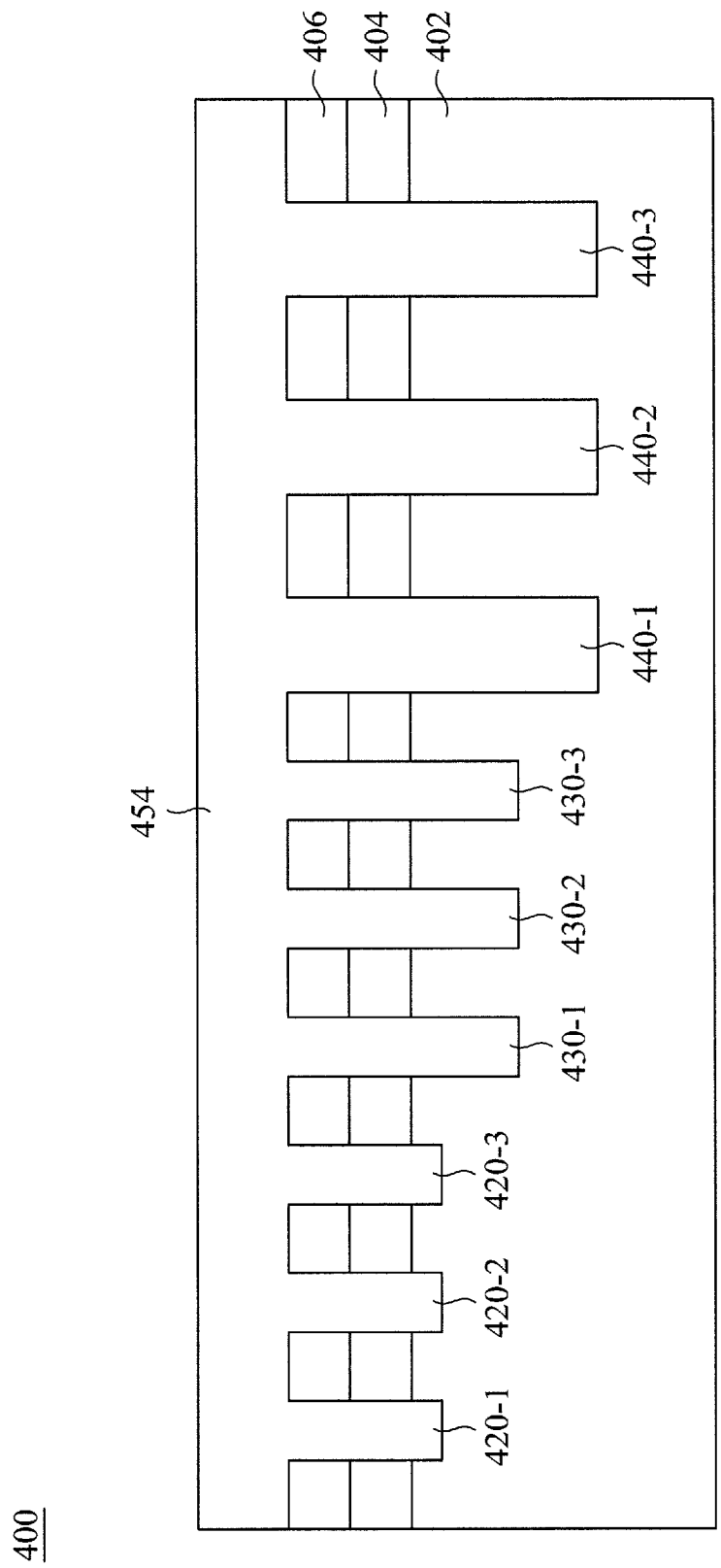

Corresponding to operation 314 of FIG. 3B, FIG. 4G is a cross-sectional view of the photonic device 400 including a dielectric material 454, which is formed at one of the various stages of fabrication, according to some embodiments. As shown, the dielectric material 454 is formed over the substrate 402 (and the remaining first and second dummy layers 404 and 406) to fill the first, second, and third sets of trenches 420-1 to 420-3, 430-1 to 430-3, and 440-1 to 440-3, respectively.

In some embodiments, the dielectric material 454 may include a material that is selected from at least one of: silicon oxide (SiO), silicon nitride (SiN), silicon oxynitride (SiON), a low dielectric constant (low-k) material, a high dielectric constant (high-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. The high-k material may include one or more of the following: AlOx, $LaAlO_3$, $HfAlO_3$, $Pr_2O_3$-based lanthanide oxide, HfSiON, Zr—Sn—Ti—O, ZrON, $HFO_2$/Hf, $ZrAl_xO_y$, $ZrTiO_4$, Zr-doped Ta oxide, $HfO_2$—$Si_3N_4$, lanthanide oxide, $TiAlO_x$, $LaAlO_x$, $La_2Hf_2O_7$, HfTaO amorphous lanthanide doped $TiO_x$, $TiO_2$, $HfO_2$, $CrTiO_3$, $ZrO_2$, $Y_2O_3$, $Gd_2O_3$, praseodymium oxide, amorphous $ZrO_xN_y$, Y—Si—O, $LaAlO_3$, amorphous lanthanide-doped $TiO_x$, $HfO_2/La_2O_3$ nanolaminates, $La_2O_3/HfO_2$ nanolaminates, $HfO_2/ZrO_2$ nanolaminates, lanthanide oxide/zirconium oxide nanolaminates, lanthanide oxide/hafnium oxide nanolaminates, $TiO_2/CeO_2$ nanolaminates, $PrO_x/ZrO_2$ nanolaminates, $Hf_3N_4/HfO_2$ nanolaminates, and $Zr_3N_4/ZrO_2$ nanolaminates.

Figure 4H:
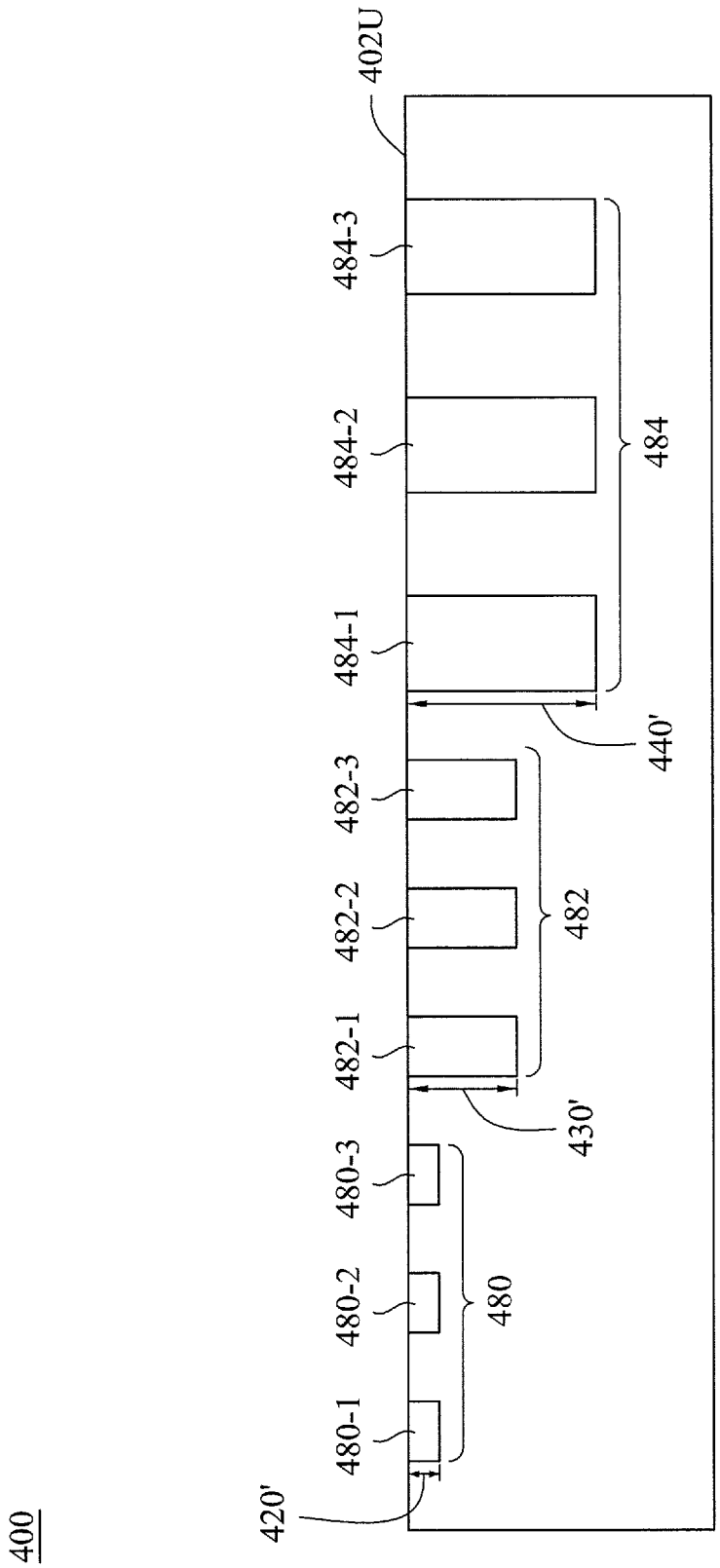

Corresponding to operation 316 of FIG. 3B, FIG. 4H is a cross-sectional view of the photonic device 400 including a first set of grating structures 480-1, 480-2, and 480-3, a second set of grating structures 482-1, 482-2, and 482-3, and a third set of grating structures 484-1, 484-2, and 484-3, which are formed at one of the various stages of fabrication, according to some embodiments. The first, second, and third sets of grating structures 480-1 to 480-3, 482-1 to 482-3, and 484-1 to 484-3 are formed at least by: performing a polishing process (e.g., a chemical mechanical polishing (CMP) process) on the dielectric material 454 formed above the upper boundary 402U of the substrate 402 and the remaining first and second dummy layers 404 and 406 (FIG. 4G); and performing a wet etching process to remove any remaining first and second dummy layers 404 and 406.

In some embodiments, the first set of grating structures 480-1 to 480-3, each extending into the substrate 402 with the depth 420', collectively form a first comb-like structure 480; the second set of grating structures 482-1 to 482-3, each extending into the substrate 402 with the depth 430', collectively form a second comb-like structure 482; and the third set of grating structures 484-1 to 484-3, each extending into the substrate 402 with the depth 440', collectively form a third comb-like structure 484.

As mentioned above with respect to FIG. 4C, the disclosed photonic device 400 can include any desired number of first recessed regions, e.g., 408-1 to 408-9. And the first recessed regions are subsequently used to form the second recessed regions (e.g., 412-1 to 412-3) and then the third recessed regions (e.g., 416-1 to 416-3), which allow the grating structures 480-1 to 480-3, 482-1 to 482-3, and 484-1 to 484-3 to be formed, respectively. Further, during the respective formation steps of the second and third recessed regions, any desired numbers of second and third recessed regions can also be formed. Thus, it is understood that the first, second, and third comb-like structures 480, 482, and 484 can each include any desired number of grating structures that share a substantially similar depth, i.e., any desired number of grating structures that are periodically arranged.

Figure 5:
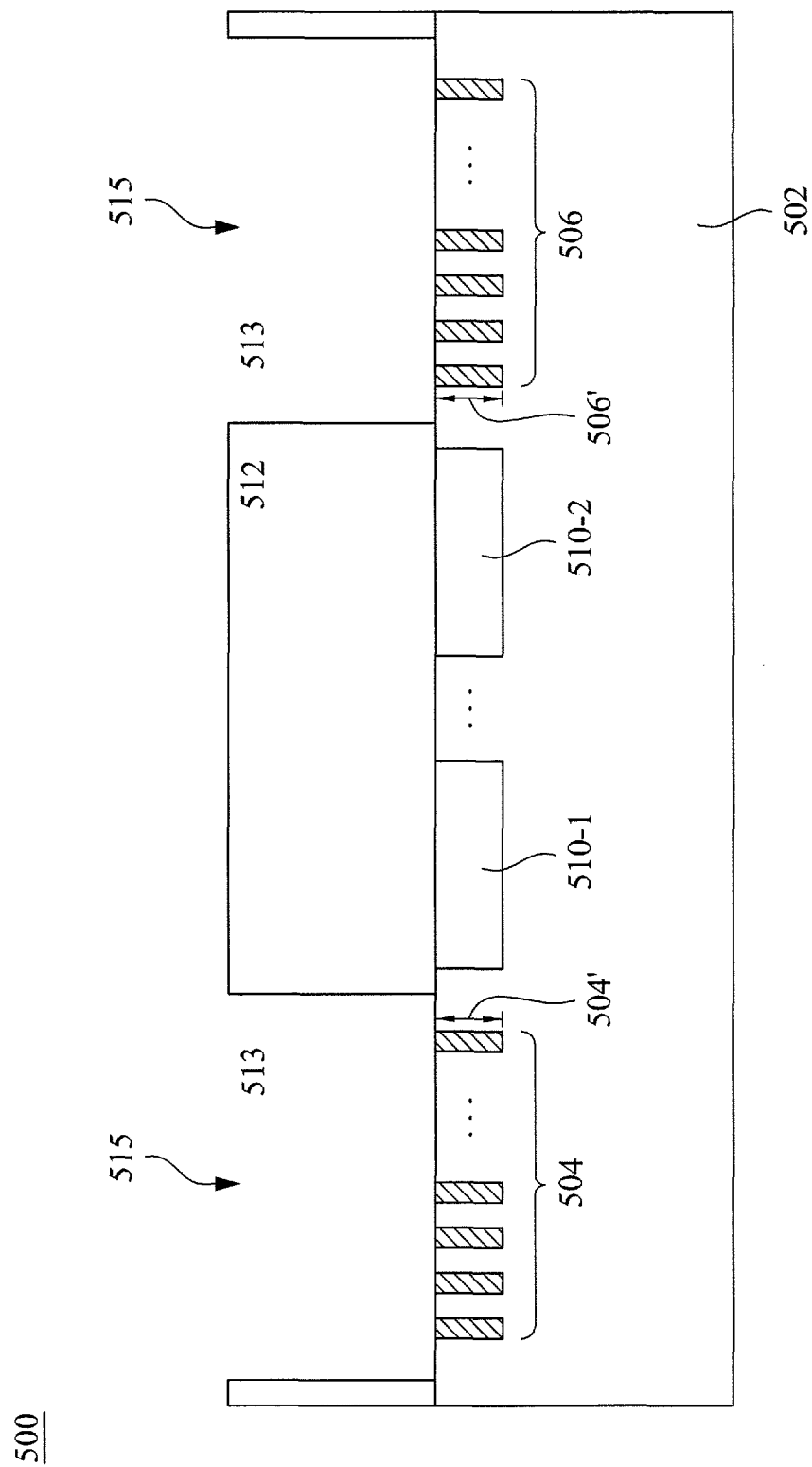
FIG. 5 illustrates a cross-sectional view of an exemplary semiconductor device, made by the method of either FIG. 1 or FIG. 3, in accordance with some embodiments.
Figure 6C:
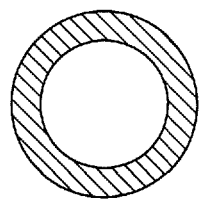
FIGS. 6A, 6B, 6C, 6D, 6E, and 6F respectively illustrate exemplary top views of comb-like structures of the semiconductor devices of FIGS. 2A-2H and 4A-4H, in accordance with some embodiments.
Figure 6F:
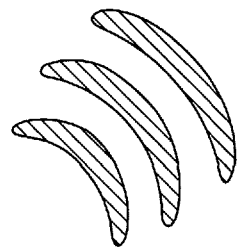
Figure 6B:
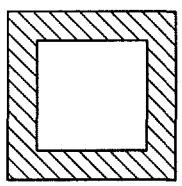
Figure 6E:
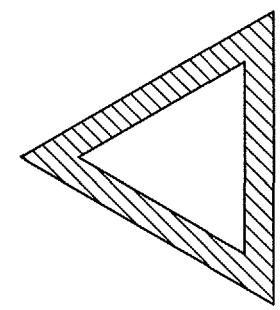
Figure 6A:
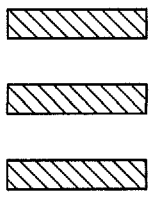
Figure 6D:
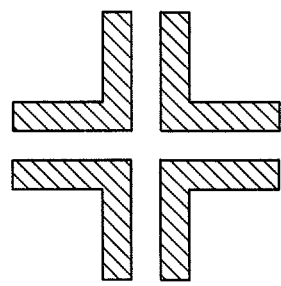

FIG. 5 illustrates an exemplary photonic device 500 that is substantially similar to the photonic devices 200 and 300 respectively shown in FIGS. 2A-2H and 4A-4H, in accordance with some embodiments of the present disclosure. As shown in FIG. 5, the photonic device 500 includes a substrate 502 that is substantially similar to the substrate 202/402, a first comb-like structure 504 with a first depth 504' and a second comb-like structure 506 with a second depth 506', different from the first depth 504', that are each substantially similar to the comb-like structures 280/282/284/480/482/484, one or more optoelectronic devices 510-1 and 510-2 (e.g., photodiodes, phototransistors, photomultipliers, optoisolators, optical modulators, or the like), and a top layer 512.

In some embodiments, the first corn-like structure 504 includes a plurality of grating structures extending into the substrate 502 with the first depth 504'; and the second corn-like structure 506 includes a plurality of grating structures extending into the substrate 502 with the second depth 506'. It is noted that the first and second comb-like structures 504 and 506 are not necessarily to be formed laterally adjacent to each other, as shown in FIG. 5. In some embodiments, although the top layer 512 formed over an upper boundary of the substrate 502 is shown as a single layer in FIG. 5, the passivation layer 512 can include a plurality of inter-layer dielectric (ILD) layers, or inter-metal dielectric (IMD) layers, formed on top of one another, and at least one passivation layer on top of the plurality of ILD/IMD layers.

In some embodiments, the top layer 512 includes respective openings 513 disposed above the first and second comb-like structures 504 and 506. Such openings 513 may be configured to allow incident radiation 515 (e.g., plural optical signals that each carriers information using a respective wavelength) to pass therethrough. In some embodiments, upon receiving the optical signals 515, the first and second comb-like structures 504 and 506 are configured to diffract (or typically referred to as "grating diffraction") the optical signals 515 so as to allow the optical signals with respective different wavelengths to pass therethrough. In other words, the first and second comb-like structures 504 and 506 can each allow a respective optical signal with a particular wavelength to pass therethrough. As such, such passed (e.g., transmitted) optical signals can be further processed by the one or more optoelectronic devices 510-1 and 510-2. For example, the transmitted optical signals may be reflected by the substrate 502, which can be an SOI, collected by the optoelectronic device 510-1, which can be a photodiode, and then amplified by the optoelectronic device 510-2, which can be an optical modulator.

FIGS. 6A, 6B, 6C, 6D, 6E, and 6F respectively illustrate exemplary top views of the comb-like structures 280/282/284/480/482/484/504/506, in accordance with some embodiments of the present disclosure. More specifically, when viewed from the top, in FIG. 6A, part or all of the grating structures of the comb-like structure (e.g., 280, 282, 284, 480, 482, 484, 504, or 506) may be laterally arranged as plural parallel strips; in FIG. 6B, part or all of the grating structures of the comb-like structure (e.g., 280, 282, 284, 480, 482, 484, 504, or 506) may be laterally arranged to form a rectangular ring; in FIG. 6C, part or all of the grating structures of the comb-like structure (e.g., 280, 282, 284, 480, 482, 484, 504, or 506) may be laterally arranged to form a circular ring; in FIG. 6D, part or all of the grating structures of the comb-like structure (e.g., 280, 282, 284, 480, 482, 484, 504, or 506) may be each formed as an "L-shaped" structure, and plural such L-shaped structures may be laterally arranged as shown; in FIG. 6E, part or all of the grating structures of the comb-like structure (e.g., 280, 282, 284, 480, 482, 484, 504, or 506) may be laterally arranged to form a triangle ring; and in FIG. 6F, part or all of the grating structures of the comb-like structure (e.g., 280, 282, 284, 480, 482, 484, 504, or 506) may be each formed as a "meniscus-like" structure, and plural such meniscus-like structures are laterally spaced apart from one another.

When viewed cross-sectionally, although the grating structures of each of the above-discussed comb-like structures 280/282/284/480/482/484/504/506 are each formed to extend into the respective substrate along a substantially vertical direction (i.e., along a direction substantially perpendicular to the upper boundary of the respective substrate), in some other embodiments, the grating structures may have any of various other shapes while remaining within the scope of the present disclosure.

Figure 7A:
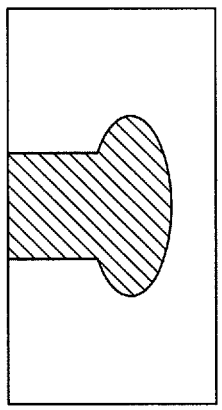
FIGS. 7A, 7B, 7C, and 7D respectively illustrate exemplary cross-sectional views of grating structures of the comb-like structures of the semiconductor devices of FIGS. 2A-2H and 4A-4H, in accordance with some embodiments.
Figure 7B:
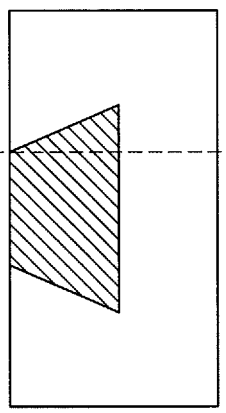
Figure 7C:
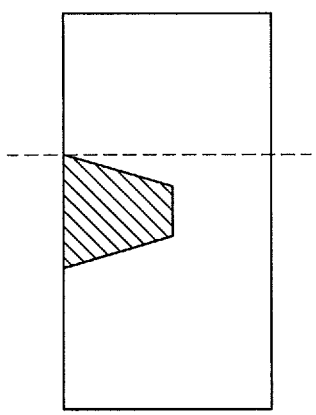
Figure 7D:
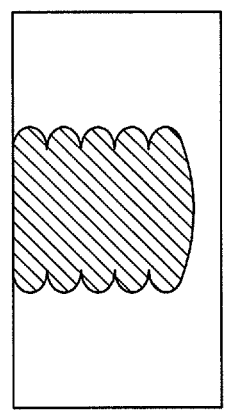

FIGS. 7A, 7B, 7C, and 7D respectively illustrate exemplary other cross-sectional shapes of the grating structures of the comb-like structures 280/282/284/480/482/484/504/506. In FIG. 7A, at least one of the grating structures (filled with diagonal stripes) of the comb-like structures 280/282/284/480/482/484/504/506 extends into a respective substrate with its both sidewalls tilted toward each other and away from a direction perpendicular to an upper boundary of the substrate; in FIG. 7B, at least one of the grating structures (filled with diagonal stripes) of the comb-like structures 280/282/284/480/482/484/504/506 extends into a respective substrate with its both sidewalls tilted away from each other and away from a direction perpendicular to an upper boundary of the substrate; in FIG. 7C, at least one of the grating structures (filled with diagonal stripes) of the comb-like structures 280/282/284/480/482/484/504/506 extends into a respective substrate with its both sidewalls substantially perpendicular to an upper boundary of the substrate and coupled by a bulb-like structure at respective lower ends of the sidewalls; and in FIG. 7D, at least one of the grating structures (filled with diagonal stripes) of the comb-like structures 280/282/284/480/482/484/504/506 extends into a respective substrate with its both sidewalls formed as ripples and coupled by a bulb-like structure at respective lower ends of the sidewalls.

In an embodiment, a method includes: forming a first plurality of tiers that each comprises first and second dummy layers over a substrate, wherein within each tier, the second dummy layer is disposed above the first dummy layer; forming a second plurality of recessed regions in the first plurality of tiers, wherein at least one subgroup of the second plurality of recessed regions extend through respective different numbers of the second dummy layers; and performing an etching operation to concurrently forming a third plurality of trenches with respective different depths in the substrate through the at least one subgroup of the second plurality of recessed regions.

In another embodiment, a method includes: forming a first etch stop layer over a substrate; forming a first mask layer over the first etch stop layer; forming a second etch stop layer over the first mask layer; forming a second mask layer over the second etch stop layer; forming two or more first recessed regions that each extends through the second mask layer; forming a second recessed region, directly below a first one of the two or more first recessed regions, that further extends through the second etch stop layer and the first mask layer; and concurrently forming first and second trenches with respective different depths in the substrate according to the a second one of the two or more first recessed regions and the second recessed region.

Yet in another embodiment, a method includes: forming N tiers of first and second dummy layers over a substrate, wherein the second dummy layer is above the first dummy layer in each tier; forming N recessed regions across the N tiers that extend through respective different numbers of second dummy layers; and concurrently forming N trenches with respective different depths in the substrate using the N recessed regions across the N tiers, wherein N is an integer equal to or greater than 2.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming a first plurality of tiers that each comprises first and second dummy layers over a substrate, wherein within each tier, the second dummy layer is disposed above the first dummy layer;
forming a second plurality of recessed regions in the first plurality of tiers, wherein at least one subgroup of the second plurality of recessed regions extend through respective different numbers of the second dummy layers; and
performing an etching operation to concurrently forming a third plurality of trenches with respective different depths in the substrate through the at least one subgroup of the second plurality of recessed regions.

2. The method of claim 1, further comprising:
using the at least one subgroup of the second plurality of recessed regions as a mask to etch the substrate thereby forming the third plurality of trenches.

3. The method of claim 2, wherein the numbers of second layers through which the at least one subgroup of the second plurality of recessed regions extend correspond to the depths of the third plurality of trenches in the substrate.

4. The method of claim 1, wherein the forming a second plurality of recessed regions in the first plurality of tiers comprises:
(a) exposing a fourth plurality of portions of the first layer at a first one of the first plurality of tiers;
(b) exposing a fifth plurality of portions of the first layer at a second one of the first plurality of tiers, wherein the second one is one tier lower than the first one, and wherein a number of the fifth plurality is less than a number of the fourth plurality; and
(c) repeating the steps (a) and (b) until the at least one subgroup of the second plurality of recessed regions are formed.

5. The method of claim 4, wherein the step (a) comprises:
etching portions of the second dummy layer at the first one of the first plurality of tiers that were disposed directly above the fourth plurality of portions of the first layer at the first one of the first plurality of tiers.

6. The method of claim 5, wherein the step (b) comprises:
etching portions of the first dummy layer at the first one of the first plurality of tiers and portions of the second dummy layer at the second one of the first plurality of tiers that were disposed directly above the fifth plurality of portions of the first layer at the first one of the first plurality of tiers, respectively.

7. The method of claim 1, further comprising:
filling the third plurality of trenches with a dielectric material.

8. The method of claim 1, wherein the first layers across the first plurality of tiers are etch stop layers.

9. A method, comprising:
forming N tiers of first and second dummy layers over a substrate, wherein the second dummy layer is above the first dummy layer in each tier;
forming N recessed regions across the N tiers that extend through respective different numbers of second dummy layers; and
concurrently forming N trenches with respective different depths in the substrate using the N recessed regions across the N tiers,
wherein N is an integer equal to or greater than 2.

10. The method of claim 9, wherein the forming N trenches in the substrate comprises:
etching the substrate through the N recessed regions on the substrate.

11. The method of claim 9, further comprising:
filling the N trenches with a dielectric material.

12. The method of claim 9, wherein the numbers of second dummy layers that the N recessed regions extend through correspond to the depths of the N trenches.

13. The method of claim 9, wherein the forming N recessed regions across the N tiers comprises:
(a) forming n first recessed regions by etching n portions of the second dummy layers at $n^{th}$ tier,
(b) forming n−1 second recessed regions by etching n−1 portions of the second dummy layers at $n-1^{th}$ tier through n—1 of the n first recessed regions,
wherein n is equal to or less than N.

14. The method of claim 13, further comprising:
repeating steps (a) and (b) until n is equal to 2.

15. The method of claim 13, wherein the first layers across the N tiers are etch stop layers.

* * * * *